(12) United States Patent
Miljkovic et al.

(10) Patent No.: US 10,161,037 B2
(45) Date of Patent: Dec. 25, 2018

(54) CONDENSATION ON SURFACES

(71) Applicant: Massachusetts Institute of Technology, Cambridge, MA (US)

(72) Inventors: Nenad Miljkovic, Cambridge, MA (US); Daniel John Preston, Cambridge, MA (US); Ryan Enright, Whitestone, NY (US); Evelyn N. Wang, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 1037 days.

(21) Appl. No.: 14/220,094

(22) Filed: Mar. 19, 2014

(65) Prior Publication Data
US 2014/0287150 A1    Sep. 25, 2014

Related U.S. Application Data

(60) Provisional application No. 61/846,696, filed on Jul. 16, 2013, provisional application No. 61/803,621, filed on Mar. 20, 2013.

(51) Int. Cl.
| B01D 59/50 | (2006.01) |
| B01D 59/42 | (2006.01) |
| C02F 1/469 | (2006.01) |
| C23C 16/44 | (2006.01) |
| B01D 5/00 | (2006.01) |

(52) U.S. Cl.
CPC ........ *C23C 16/4414* (2013.01); *B01D 5/0042* (2013.01)

(58) Field of Classification Search
None
See application file for complete search history.

(56) References Cited

U.S. PATENT DOCUMENTS

| 4,670,026 A | 6/1987 | Hoenig |
| 2001/0029842 A1 | 10/2001 | Hoenig |
| 2005/0113936 A1* | 5/2005 | Brustad ............ A61B 17/06166 623/23.71 |
| 2005/0235869 A1* | 10/2005 | Cruchon-Dupeyrat ..................... B82Y 10/00 106/31.29 |
| 2005/0282682 A1* | 12/2005 | Ishii ...................... B60W 10/06 477/107 |

(Continued)

FOREIGN PATENT DOCUMENTS

| DE | 4118733 | 12/1992 |
| WO | 2012/023859 A1 | 11/2012 |

OTHER PUBLICATIONS

Ambrozewica, Damian et al, "Fluoroalkylsilane versus Alkylsilane as Hydrophobic Agents for Silica and Silicates," Aug. 28, 2013, Hindawi Publishing Corporation, Journal of Nanomaterials vol. 2013, Article ID 631938, 13 pages.*

(Continued)

*Primary Examiner* — Jill A Warden
*Assistant Examiner* — Brittany Fisher
(74) *Attorney, Agent, or Firm* — Steptoe & Johnson LLP

(57) ABSTRACT

A uniform external field can enhance condensation on a superhydrophobic surface. Jumping droplets on superhydrophobic surfaces accumulate a positive charge which promises the manipulation and control of jumping behavior using external electric fields.

13 Claims, 24 Drawing Sheets

(56) References Cited

U.S. PATENT DOCUMENTS

| | | | |
|---|---|---|---|
| 2006/0040375 A1* | 2/2006 | Arney | B01L 3/508 435/287.1 |
| 2007/0059510 A1* | 3/2007 | Krupenkin | B01L 3/502792 428/304.4 |
| 2007/0245898 A1 | 10/2007 | Naito et al. | |
| 2009/0078326 A1* | 3/2009 | Rosario | B01L 3/502707 137/827 |
| 2010/0152880 A1* | 6/2010 | Boyden | A61K 9/0019 700/117 |
| 2012/0012804 A1* | 1/2012 | Chen | F28D 15/0233 257/2 |
| 2012/0211109 A1* | 8/2012 | Hernandez | F04B 17/00 137/803 |
| 2012/0276334 A1* | 11/2012 | Fedynyshyn | B05D 5/04 428/141 |
| 2014/0287150 A1* | 9/2014 | Miljkovic | B01D 5/0042 427/458 |
| 2016/0160436 A1* | 6/2016 | Lyons | B08B 17/065 442/62 |

OTHER PUBLICATIONS

Miljkovic, Nenad et al, "Jumping-Droplet-Enhanced Condensation on Scalable Superhydrophobic Nanostructured Surfaces," Nov. 28, 2012, ACS Nano Letters 2013, 13, 179-187.*

International Search Report dated Jan. 23, 2015, issued in International Application No. PCT/US2014/031259.

Written Opinion of the International searching Authority dated Jan. 23, 2015, issued in International Application No. PCT/US2014/031259.

Notification Concerning Transmittal of International Preliminary Report on Patentability (Chapter I of the Patent Cooperation Treaty) dated Oct. 1, 2015, issued in International Application No. PCT/US2014/031259.

Nenad Miljkovic et al: "Jumping-Droplet-Enhanced Condensation Superhydrophobic Nanostructured Surfaces", NANO Letters, vol. 13, No. 1, Jan. 9, 2013 (Jan. 9, 2013), pp. 179-187, XP055158429, ISSN: 1530-6984, DOI: 10.1021/nl303835d p. 179-p. 182.

* cited by examiner

CONDENSATION ON SURFACES

CLAIM OF PRIORITY

This application claims priority to U.S. Patent Application 61/846,696, filed Jul. 16, 2013, and U.S. Patent Application 61/803,621, filed Mar. 20, 2013, each of which is incorporated by reference in its entirety.

STATEMENT OF GOVERNMENT SUPPORT

This invention was made with government support under Grant Nos. DE-SC0001299 and DE-FG02-09ER46577 awarded by the Department of Energy and under Contract No. N00014-12-1-0624 awarded by the Navy ONR. The government has certain rights in the invention.

TECHNICAL FIELD

The present invention relates to condensation on surfaces.

BACKGROUND

When two or more droplets coalesce, they can spontaneously jump away from a superhydrophobic surface due to the release of excess surface energy, which promises enhanced system performance by passively shedding water droplets. See Boreyko, J. B. & Chen, C. H. Self-Propelled Dropwise Condensate on Superhydrophobic Surfaces. *Phys Rev Lett* 103, 184501-184501-184501-184504, (2009), and Miljkovic, N. et al. Jumping-Droplet-Enhanced Condensation on Scalable Superhydrophobic Nanostructured Surfaces. *Nano Lett* 13, 179-187, (2013), each of which is incorporated by reference in its entirety.

When two discrete fluid droplets merge on a flat surface, they combine to form one larger fluid mass in order to minimize surface energy. When this coalescence process occurs on a suitably designed superhydrophobic surface, the coalesced droplets can spontaneously jump (Boreyko, *PRL*, 2009). In order to form droplets small enough (≈10-100 µm) to enable jumping, many researchers have resorted to droplet formation via vapor condensation. In addition to enabling the study of droplet jumping, vapor condensation on superhydrophobic surfaces has been a significant topic of interest for a variety of industrial applications due to the reduced steady-state droplet distribution, which enhances heat transfer performance by 30% (Miljkovic, *Nano Lett*, 2013), reduces ice buildup (Boreyko, J. B. & Collier, P. C. Delayed Frost Growth on Jumping-Drop Superhydrophobic Surfaces. *Acs Nano*, (2013), which is incorporated by reference in its entirety), and allows for self-cleaning (Wisdom, K., Watson, J., Watson, G. & Chen, C.-H. in 65*th Annual Meeting of the APS Division of Fluid Dynamics*. (ed Bulletin of the American Physical Society) (Bulletin of the American Physical Society), which is incorporated by reference in its entirety.). To date, researchers have focused on creating superhydrophobic surfaces showing rapid droplet removal (Chen, X. et al. Nanograssed Micropyramidal Architectures for Continuous Dropwise Condensation. *Adv Funct Mater* 21, 4617-4623, (2011), which is incorporated by reference in its entirety) and experimentally analyzing (Enright, R., Miljkovic, N., Al-Obeidi, A., Thompson, C. V. & Wang, E. N. Superhydrophobic Condensation: The Role of Length Scale and Energy Barriers. *Langmuir* 40, 14424-14432, (2012), which is incorporated by reference in its entirety.) and modeling (Wang, F. C., Yang, F. Q. & Zhao, Y. P. Size effect on the coalescence-induced self-propelled droplet. *Appl Phys Lett* 98, (2011), which is incorporated by reference in its entirety.) the merging and jumping behavior prior to and immediately after coalescence. However, aspects related to the droplet charging during the formation, growth and jumping of droplets have not been identified.

SUMMARY

In general, a uniform external field can enhance condensation on a superhydrophobic surface. Jumping droplets on superhydrophobic surfaces can accumulate a positive charge which promises the manipulation and control of jumping behavior using external electric fields.

In one aspect, a method of controlling condensation on a surface include applying external electric fields to the surface, the surface being configured to condense a liquid from a vapor phase. The surface can be a superhydrophobic surface.

In certain circumstances, the surface can include a substrate including a metal and including a plurality of nanostructures on a surface of the substrate including a metal oxide of the metal, and a surface modifying layer on at least a portion of the nanostructures.

In certain other circumstances, the surface can include a metal coating on the nanostructures.

In certain other circumstances, the surface can be made of a material selected from the group consisting of silicon, silica, copper, copper oxide, zinc oxide and aluminum.

In certain embodiments, a portion of the surface can include a surface modifying layer including a surface modifying compound. The surface modifying layer can include a self-assembled monolayer on the metal coating.

In certain other embodiments, the surface modifying layer can include a thiol on a surface of the nanostructures. The thiol can be an alkyl thiol, for example, a fluorinated alkyl thiol.

In certain other embodiments, the surface modifying layer can include a silane on a surface of the nanostructures. For example, the silane is an alkyl silane, such as a fluorinated alkyl silane. The silane can be deposited on the nanostructures.

In certain other embodiments, the surface modifying layer can include a fluorinated polymer. The fluorinated polymer can be deposited on the nanostructures.

Other features, objects, and advantages will be apparent from the description and drawings, and from the claims.

BRIEF DESCRIPTION OF THE DRAWINGS

FIG. 18A inset shows condensation heat flux ($q_c''$) as a function of surface to vapor temperature difference (ΔT) for different departure radii (5 μm<$R_e$<100 μm).

DETAILED DESCRIPTION

Figure 1:
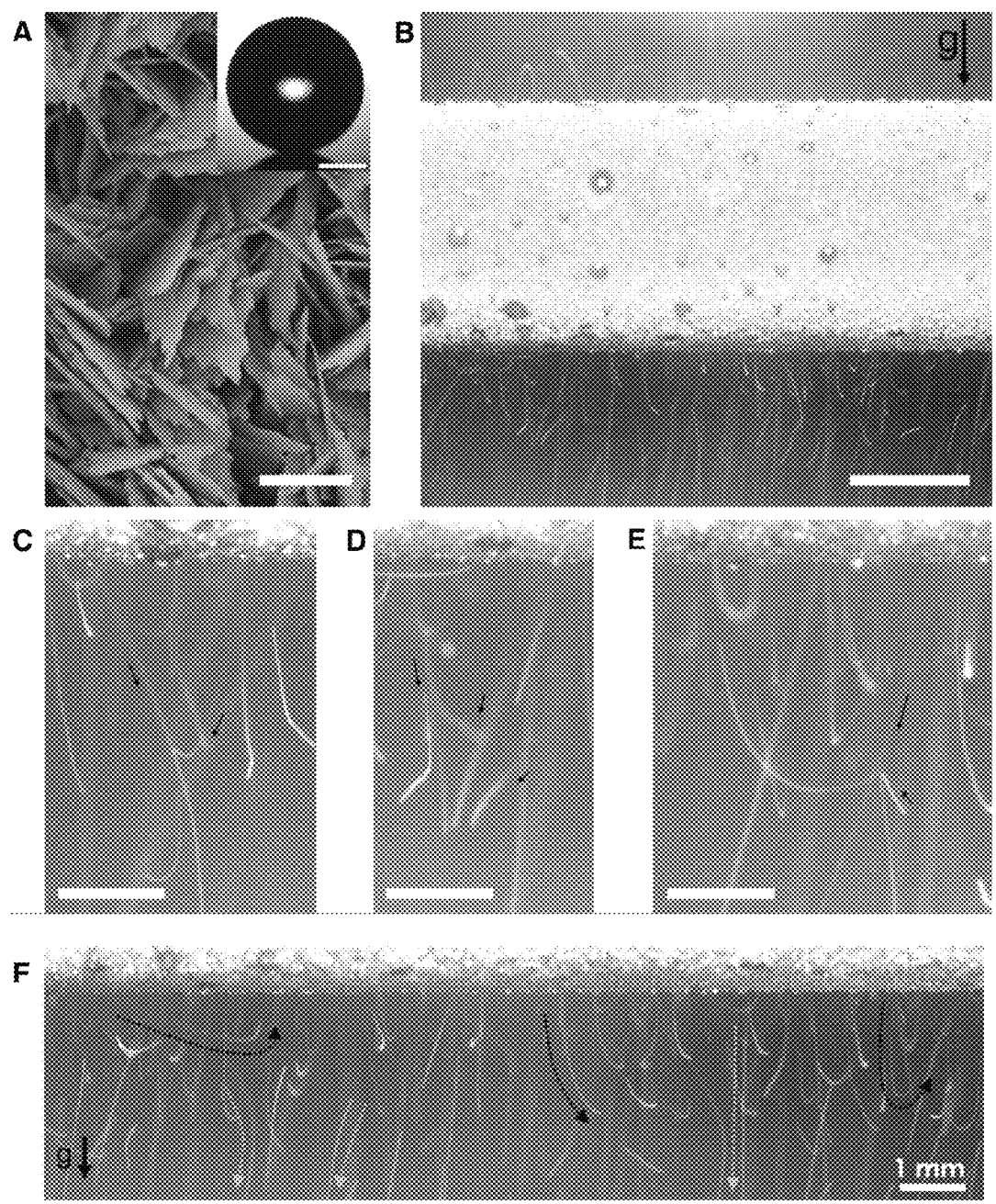
FIGS. 1A-1F are photographs depicting nanostructure characterization and jumping droplet interactions.

Condensation is an important process in both emerging and traditional power generation and water desalination technologies. Superhydrophobic nanostructures promise enhanced condensation heat transfer by reducing the characteristic size of departing droplets via a surface-tension-driven mechanism. See, for example, Boreyko, J. B. and C.-H. Chen, *Self-Propelled Dropwise Condensate on Superhydrophobic Surfaces*. Physical Review Letters, 2009. 103 (18): p. 184501, which is incorporated by reference in its entirety. In this work, a scalable synthesis technique was investigated to produce oxide nanostructures on copper surfaces capable of sustaining superhydrophobic condensation and characterized the growth and departure behavior of condensed droplets. Nanostructured copper oxide (CuO) films were formed via chemical oxidation in an alkaline solution. A dense array of sharp CuO nanostructures with characteristic heights and widths of ~1 μm and ~300 nm, respectively, were formed. A gold film was deposited on the surface and functionalized with a self-assembled monolayer to make the surfaces hydrophobic. Condensation on these surfaces was then characterized using optical microscopy (OM) and environmental scanning electron microscopy (ESEM) to quantify the distribution of nucleation sites and elucidate the growth behavior of individual droplets with a characteristic size of ~1 to 10 μm at low supersaturations. CuO surfaces can offer superior condensation behavior in terms of emergent droplet morphology and coalescence dynamics and a significant enhancement in heat transfer performance when compared to state-of-the-art condensing surfaces. Furthermore, the chemical-oxidation-based CuO fabrication process provides a simple and readily scalable method to create superhydrophobic condensation surfaces that can sustain droplet jumping behavior. Comparison of the observed behavior to a recently developed model for condensation on superhydrophobic surfaces (see, Miljkovic, N., R. Enright, and E. N. Wang, *Growth Dynamics During Dropwise Condensation on Nanostructured Superhydrophobic Surfaces*, in *Proceedings of the 3rd Micro/Nanoscale Heat & Mass Transfer International Conference*. 2012, ASME: Atlanta, Ga. and Miljkovic, N., R. Enright, and E. N. Wang, *Dropwise condensation droplet growth dynamics on*

*superhydrophobic surfaces*. unpublished 2011, each of which is incorporated by reference in its entirety) suggests a restricted regime of heat transfer enhancement compared to a corresponding smooth hydrophobic surface due to the large apparent contact angles demonstrated by the CuO surface.

Efficient condensation is required for a range of industrial processes. In particular the efficiency of steam power cycles, thermal-based desalination, and phase-change-based thermal management solutions for electronics cooling are functionally dependent on the condensation behavior of water on heat transfer surfaces. In the 1930's, Schmidt and co-workers identified dropwise condensation (DWC) as a superior mode of heat transfer in comparison to filmwise condensation (FWC) (see Schmidt, E., Schurig, W. and Sellschopp, W. *Tech. Mech. Thermodynamik*, 1, 53-63 (1930), which is incorporated by reference in its entirety). Subsequent investigations found that DWC heat transfer rates could be up to an order of magnitude larger than those associated with FWC. See, for example, Rose, J. W. *Proc Instn Mech Engrs*, Vol 216, Part A: J Power and Energy (2002), which is incorporated by reference in its entirety. To achieve efficient DWC, condensate droplets must be rapidly removed from the surface because the increasing droplet size acts as a thermal barrier. DWC is associated with the periodic departure of large, thermally-insulating droplets from the surface, typically under the influence of gravity, that allows for the re-growth of smaller droplets with reduced thermal resistance on the exposed areas. Rose and co-workers (id.) have argued that the self-similar distribution of drop sizes is a significant factor governing the overall rate of heat transfer. Under the influence of gravity, the requirement for droplet departure, to first order, is given by $Bo=\rho g d^2/\gamma \geq 1$, where $\rho$ is the condensate density, g is the local acceleration due to gravity, d is the droplet diameter, and $\gamma$ is the condensate surface tension. For water, this leads to a distribution of droplets ranging in size from the critical nucleus (~1 nm) up to the capillary length (~1 mm). However, recent investigations by Boreyko & Chen (PRL, 2009) have demonstrated that the upper drop size can be restricted to less than 100 μm ($Bo<10^{-3}$) via a surface-tension-driven departure mechanism that occurs on nanostructured superhydrophobic surfaces. When small droplets (e.g. ~10-100 μm) merge on suitably designed superhydrophobic surfaces, they can undergo coalescence-induced droplet ejection or "jumping" independent of gravity due to the release of excess surface energy. The nanostructured surface beneath the coalescing droplets reduces the droplet adhesion to the substrate by minimizing the solid fraction and breaks the symmetry of the coalesced droplet. As a result, the droplet accelerates and departs perpendicular to the surface. Such droplet jumping offers an avenue to further enhance condensation heat transfer over conventional dropwise condensation by increasing the time-averaged density of small droplets, which transfer heat more efficiently from the vapor to the substrate. Accordingly, these surfaces are attractive for applications such as atmospheric water harvesting and dehumidification where the heat fluxes are relatively low and droplets can be maintained in a highly mobile state.

Here, it is shown that jumping droplets on a variety of superhydrophobic surfaces gain a net positive charge that causes them to repel each other mid-flight. In a modified experiment inspired by that of Millikan (see Millikan, R. A. On the Elementary Electrical Charge and the Avogadro Constant. *Physical Review* 2, 109-143, (1913), which is incorporated by reference in its entirety.), a uniform electric field was used to quantify the charge on the droplets and showed that the charge is dependent on the surface area of the departing droplet and the hydrophobic coating. Accordingly, the mechanism for the charge accumulation was explained, which is associated with the formation of the electric double layer at the droplet-coating interface, and subsequent charge separation during droplet jumping. The results demonstrate the important role of surface charge interactions on jumping droplet dynamics and also provide insight into jumping droplet physics. This work is also a starting point for more advanced approaches for enhancing jumping droplet surface performance. For example, an external electric field can control the jumping efficiency to enhance condensation heat transfer, anti-icing, and self-cleaning performance. Furthermore, the charge separation phenomenon promises an advantageous metrology to characterize the zeta potential of hydrophobic coatings on large scale superhydrophobic surfaces.

This study shows that jumping droplets on superhydrophobic surfaces accumulate a positive charge which promises the manipulation and control of jumping behavior using external electric fields. To this end, the jumping phenomena on superhydrophobic surfaces with different surface structures, hydrophobic coatings, and under the influence of varying electric fields was investigated to elucidate the nature of the charging phenomenon, quantify the charge behavior, and provide insights into the modeling and design of these surfaces for a variety of industrial applications.

Jumping Droplet Return

To characterize droplet-droplet interactions on a well-defined surface, the jumping droplet behavior of copper (Cu) tubes coated with functionalized copper oxide (CuO) nanostructures (FIG. 1A, see Methods) was investigated by condensing water vapor on the surface and observing droplet jumping. The radial geometry of the tubes allowed for simultaneous high speed imaging of the top (against gravity) and bottom (with gravity) surfaces. To visualize the behavior, the CuO tubes were tested in a controlled condensation chamber interfaced with a high speed camera FIG. 1A is a field emission scanning electron micrograph (FESEM) of a 10 minute oxidized CuO surface. Scale bar is 500 nm. The sharp, knife-like CuO structures have characteristic heights, h≈1 μm, solid fraction, φ≈0.023, and roughness factor, r≈10. The inset shows the water droplet contact advancing angle on the nanostructured superhydrophobic surface, $\theta_a=169\pm3°$. Scale bar is 20 μm. Hydrophobic functionalization was obtained by depositing a fluorinated silane (trichloro(1H,1H,2H,2H-perfluorooctyl)silane, Sigma-Aldrich) in the vapor phase (see Methods). This self-assembled silane coating (hereafter labeled "TFTS") had a typical advancing angle of $\theta_a \approx 120°$ when measured on a smooth reference surface and typical advancing/receding angles of $\theta_a/\theta_r \approx 171/167\pm3°$ when measured on the nanostructured CuO surface. To observe droplet jumping, the CuO tubes were tested in a controlled condensation chamber (see, section S1). Prior to performing the experiments, the water for the vapor supply was vigorously boiled and the test chamber was evacuated to a pressure P<0.5±0.025 Pa to eliminate non-condensable gases. Throughout the experiments, the chamber pressure and temperature were continuously monitored to ensure saturated conditions. The temperature of the tube was independently controlled via a cooling loop (see sections S1 and S2).

FIG. 1B shows a long exposure image (50 ms) taken during steady-state condensation on the CuO tube, where the white streaks are the trajectories of the jumping droplets. The CuO surface showed very efficient droplet removal via the jumping mechanism, with numerous microscale droplets departing from the surface. FIG. 1B also shows significant droplet-droplet interactions after droplets departed from the surface, as seen by the rapid directional changes in the droplet trajectories. FIGS. 1C-1E show the long exposure time (50 ms) false-color images of droplet-droplet repulsive interactions. Scale bar is 1 mm. Chamber vapor pressure $P_v$=2700±68 Pa, S≈1.06. The tube sample (outer diameter $D_{OD}$=6.35 mm, inner diameter $D_{ID}$=3.56 mm, and length L=131 mm) was cooled via chilled water flowing inside the tube at 5±0.1 L/min, see section S2. FIGS. 1C-1E highlight that when droplets approach one another, they tend to repel each other and do not coalesce, an unexpected observation if the droplets were neutral (see Adam, J. R., Lindblad, N. R. & Hendricks, C. D. The Collision, Coalescence, and Disruption of Water Droplets. *J Appl Phys* 39, 5173-5180, (1968), which is incorporated by reference in its entirety). Instead, the mid-flight repulsion indicates that droplets may carry electric charge. Furthermore, the uniform repulsive interaction of droplets shows that the charge polarity, i.e., positive or negative, must be identical for all jumping droplets.

Droplets departing from the top of the tube returned to the tube surface, presumably due to gravitational force. However, droplets leaving the tube bottom (with gravity) sometimes returned to the bottom surface as well (FIG. 1F). This return of droplets against gravity implies that either a bulk vapor flow was present which traveled upwards (i.e., due to buoyancy), or that a local mass-conserving radial vapor flow moving towards the tube entrained droplets and caused them to return to the surface. A flow blockage was included beneath the tube to study the potential effect of a buoyant flow. Return of droplets from the bottom surface was as frequent as before indicating that buoyancy-induced bulk vapor flow was not the mechanism of droplet return (see section S8).

The second possible mechanism capable of causing droplet return is from entrainment of droplets in the local vapor flow towards the tube due to condensate mass conservation (i.e., water vapor supplied to the condensing surface). To examine this hypothesis, the radial vapor flow towards the tube was modeled to obtain the drag on departing droplets. The model was simplified by assuming that a jumping droplet departs normal to the surface directly downward in the direction of gravity. It was also assumed that, due to the relatively small size of departing droplets (~10 μm), the shape of droplets remained spherical during flight. This assumption is justified given that the vapor density is small compared to the density of the liquid droplets ($\rho_v \ll \rho_w$) and $Bo=\rho_w \cdot g \cdot R^2/\gamma \ll 1$, where Bo and R are the droplet Bond number and radius (~10 μm), respectively, $\rho_w$ and $\gamma$ are the water density (≈1000 kg/m³) and surface tension (≈72 mN/m), respectively, and g is the gravitational constant. In addition, $We=(\rho_v \cdot U_v^2 \cdot R)/\gamma \ll 1$ and $Ca=\mu_v \cdot U_v/\gamma \ll 1$, where We and Ca are the Weber and Capillary numbers, respectively, $U_v$ is the characteristic vapor velocity (~0.1 m/s), and $\rho_v$ is the vapor density (≈0.02 kg/m³), and $\mu_v$ is the vapor dynamic viscosity (≈9.8 μPa·s). See, Stone, H. A. Dynamics of Drop Deformation and Breakup in Viscous Fluids. *Annu. Rev. Fluid Mech.* 1994, 26, 65-102, which is incorporated by reference in its entirety. FIG. 15A shows a cross-sectional schematic of the developed model with a magnified view showing the force balance on a departing droplet.

The equation of motion for the departing droplet, which includes inertia (first term), the gravitational force ($F_g$, second term), and the drag force due to vapor flowing in the reverse direction ($F_D$, third term) is:

$$\frac{4}{3}\pi R^3 \rho_w \frac{dv}{dt} = \frac{4}{3}\pi R^3 g \rho_w - \frac{1}{2}\rho_v \pi R^2 C_D (v + u_v(x))^2, \quad (1)$$

where R is the droplet radius, v is the droplet velocity, t is time, g is the gravitational constant, $C_D$ is the Reynolds number dependent drag coefficient on a sphere,[69] and $u_v$ is the velocity of the vapor flow past the spherical jumping droplet. To determine the vapor velocity, mass conservation is applied to the condensing vapor. The tube heat transfer rate, q (measurable quantity), is then balanced by the energy released via vapor-to-liquid phase change:

$$\dot{m}h_{fg}=q, \quad (2)$$

where $h_{fg}$ and $\dot{m}$ are the latent heat of vaporization and the mass flow rate towards the tube of the condensing vapor, respectively. Therefore, relating the mass flow rate to the vapor velocity gives an expression for the vapor velocity as:

$$u_v(x) = \frac{R_t q''}{\rho_v (R_t + x) h_{fg}}, \quad (3)$$

where $R_t$ is the condensing tube outer radius, x is the distance from the tube surface, and q″ is the heat flux (heat transfer per unit area).

In order to obtain the droplet trajectory, the initial condition relating the jumping velocity (U) of the droplet leaving the tube surface to the droplet radius (R) is needed. Although a previous study experimentally determined the initial droplet velocity as a function of radius, a carbon nanotube surface with droplets condensing at atmospheric pressure was studied, which is distinct form the experiments carried out at low vapor pressures (<4 kPa). See, Boreyko, J. B.; Chen, C. H. Self-Propelled Dropwise Condensate on Superhydrophobic Surfaces. *Phys. Rev. Lett.* 2009, 103, 184501, which is incorporated by reference in its entirety. To minimize uncertainties associated with the different experimental conditions, the initial droplet velocity was experimentally determined as a function of departing droplet radius. For water droplets of radii R≳2 μm, coalescence is governed by an inertially-limited viscous regime at low neck radii ($R_{min}/R$)≤Oh, where $R_{min}$ is the radius of the neck connecting the two coalescing droplets, and Oh is the characteristic droplet Ohnesorge number defined by Oh=μ/$(\rho_w \cdot \sigma \cdot R)^{1/2}$ and by an inertial regime at larger neck radii ($R_{min}/R$>Oh). See, Paulsen, J. D.; Burton, J. C.; Nagel, S. R.; Appathurai, S.; Harris, M. T.; Basaran, O. A. The Inexorable Resistance of Inertia Determines the Initial Regime of Drop Coalescence. *Proc. Natl. Acad. Sci. U.S.A.* 2012, 109, 6857-6861, which is incorporated by reference in its entirety. Due to the relatively low Ohnesorge number, Oh≈0.02 to 0.1, the majority of droplet coalescence (>90% for R=2 μm) occurs in the inertial regime where the time scale is governed by a capillary inertial scaling. See, Eggers, J.; Lister, J. R.; Stone, H. A. Coalescence of Liquid Drops. *J. Fluid Mech.* 1999, 401, 293-310, Paulsen, J. D.; Burton, J. C.; Nagel, S. R. Viscous to Inertial Crossover in Liquid Drop Coalescence. *Phys. Rev. Lett.* 2011, 106, 114501, and Wu, M. M.; Cubaud, T.; Ho, C. M. Scaling Law in Liquid Drop Coalescence Driven by Surface Tension. *Phys. Fluids.* 2004, 16, 51-54, each of which is incorporated by reference in its entirety. Balancing the excess surface energy and kinetic energy of the jumping droplet, the characteristic scaling for the droplet velocity is obtained:

$$U \sim \sqrt{\gamma/\rho R}. \quad (4)$$

This characteristic velocity corresponds to a value of unity for the droplet Weber number, $We=(\rho_w \cdot U^2 R)/\gamma=1$. To account for the incomplete conversion of excess surface energy to kinetic energy not captured by the scaling, a proportionality constant C is introduced, on the right hand side of equation (4). For the experiments on CuO at low vapor pressure ($P_v$<4000 Pa), equation (4) best fits the experimental data with C≈0.23 (see section S9).

Figure 15:
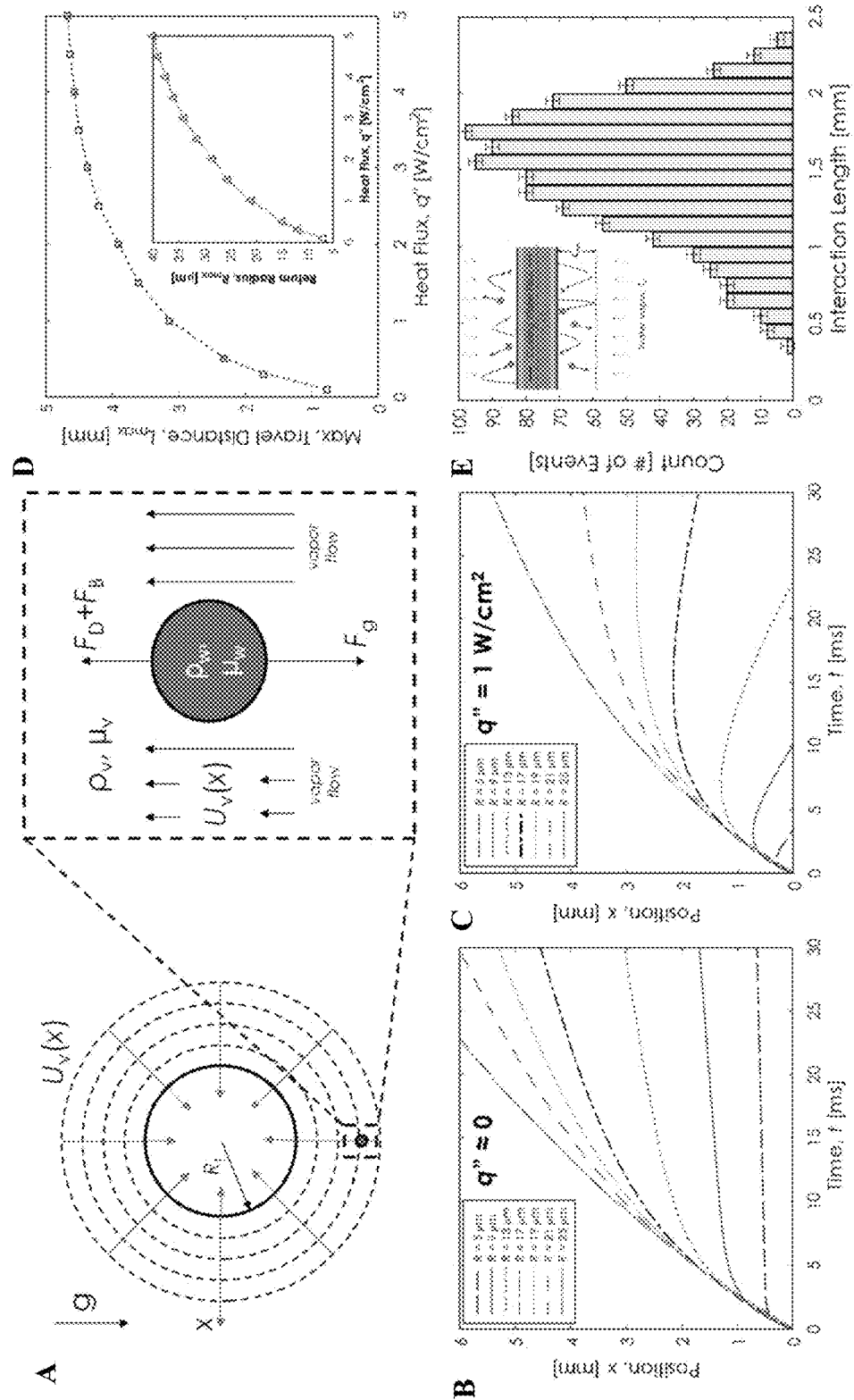
FIG. 15A is a schematic showing the condensing vapor flow velocity $U_v(x)$ towards the condensing tube as a function of radial position x.
FIGS. 15B-15E are graphs depicting jumping-droplet vapor flow entrainment.

Combining the initial condition (Eq 4) and the vapor flow velocity (Eq 3) with the droplet equation of motion (Eq 1) (using a numerical discretization with a Runge-Kutta method), the droplet position beneath the tube (x) was determined as a function of time (t) for varying droplet radius (R) and condensing tube heat flux (q") (FIGS. 15B and 15C). FIG. 15A is a schematic showing the condensing vapor flow velocity $U_v(x)$ towards the condensing tube as a function of radial position x. The model only considers droplets traveling downward in the direction of gravity (as shown in the close-up schematic). The forces acting on the droplets are gravity ($F_g$), buoyancy ($F_B$), and drag due to vapor flow ($F_D$) ($R_t$=3.16 mm). Note, $F_B \ll F_g$ due to the large density difference between liquid water and water vapor ($\rho_v \ll \rho_w$). The model was used to calculate the droplet position x beneath the tube as a function of time t for a condensing heat flux of q"≈0 W/cm² (FIG. 15B) and q"=1 W/cm² (FIG. 15C). FIG. 15B shows that when the vapor flow velocity towards the surface is much smaller than the droplet jumping velocity (q"≈0), all droplets depart from the surface and do not return. In the absence of vapor drag, the gravitational force ensures that all droplets are removed. However, if the tube heat flux is increased to q"=1 W/cm² (FIG. 15), droplet entrainment in the condensing vapor flow becomes significant, with droplets smaller than R≈19 μm returning to the surface against gravity. In contrast, droplets larger than R≈19 μm have enough gravitational body force acting on them to depart from the surface such that they do not return from entrainment in the vapor flow. To further characterize the effects of condensate vapor flow on droplet departure, the maximum distance that the largest entrained droplets travel downward away from the tube prior to being returned to the surface ($L_{max}$) was calculated as a function of condensation heat flux (FIG. 15D). As the condensation heat flux increased, the maximum distance also increased due to the entrainment of progressively larger departing droplets (FIG. 15D inset, maximum droplet radius $R_{max}$, corresponding to, $L_{max}$, being returned to the condensing tube as a function of heat flux q"). At larger heat fluxes, larger droplets return due to faster condensing vapor flow and a larger drag force $F_D$ towards the tube surface.

To experimentally verify the developed model, droplet trajectories directly below the condensing tube was analyzed (FIG. 1F) at a heat flux of q"≈0.8±0.2 W/cm² using high speed imaging. For each departing droplet which returned to the surface against gravity, the maximum vertical distance traveled beneath the tube prior to droplet return (interaction length) was measured. FIG. 15E shows a histogram of droplet interaction lengths measured during the experiment. The maximum distance a droplet traveled away from the tube before returning to the surface was $L_{max,exp}$≈2.4 mm, which is in excellent agreement with the model solution shown in FIG. 15D, which predicted $L_{max}$≈2.5 mm at a heat flux of q"=0.8 W/cm². The interaction length is defined as the maximum distance a droplet travels before being returned to the condensing surface due to vapor flow entrainment. The agreement between experiments and theory indicates that droplet return (FIG. 1F) is due to vapor flow entrainment.

These experimental and model results indicate a fundamental limit to jumping-droplet condensation. Due to the entrainment of departing droplets, the maximum attainable heat flux is limited since larger heat fluxes result in faster vapor flow and more droplet return. As a result, this limitation presents an opportunity to utilize external body or surface forces to further aid droplet removal from the surface at high fluxes, whether from forced convection, Marangoni stresses, or electrostatic fields. See, Carey, V. P. *Liquid-Vapor Phase-Change Phenomena: An Introduction to the Thermophysics of Vaporization and Condensation Processes in Heat Transfer Equipment.* 2nd ed.; Taylor and Francis: New York, 2008; p xxii, 742 p, Chang, T. B. Mixed-Convection Film Condensation Along Outside Surface of Vertical Tube in Saturated Vapor With Forced Flow. *Appl. Therm. Eng.* 2008, 28, 547-555, Michael, A. G.; Rose, J. W.; Daniels, L. C. Forced Convection Condensation on a Horizontal Tube-Experiments With Vertical Downflow of Steam. *J. Heat Trans.* 1989, 111, 792-797, Zhang, L.; Subramanian, R. S.; Balasubramaniam, R. Motion of a Drop in a Vertical Temperature Gradient at Small Marangoni Number—The Critical Role of Inertia. *J. Fluid Mech.* 2001, 448, 197-211, and Miljkovic, N.; Preston, D. J.; Enright, R.; Wang, E. N. Electrostatic Charging of Jumping Droplets. *Nat. Commun.* 2013, 4, 2517, doi:10.1038/ncomms3517, each of which is incorporated by reference in its entirety. Electric fields were chosen due to the recent discovery that jumping droplets also gain a positive electrostatic charge as they leave the condensing surface due to electric double layer charge separation on the hydrophobic coating. See, Miljkovic, N.; Preston, D. J.; Enright, R.; Wang, E. N. Electrostatic Charging of Jumping Droplets. *Nat. Commun.* 2013, 4, 2517, doi:10.1038/ncomms3517, which is incorporated by reference in its entirety. Exploiting this electrostatic charge using external electric fields provides a unique and easily implementable approach to enhance droplet removal from superhydrophobic nanostructured condensing surfaces.

Electric Field Manipulation of Charged Jumping Droplets

Figure 2:
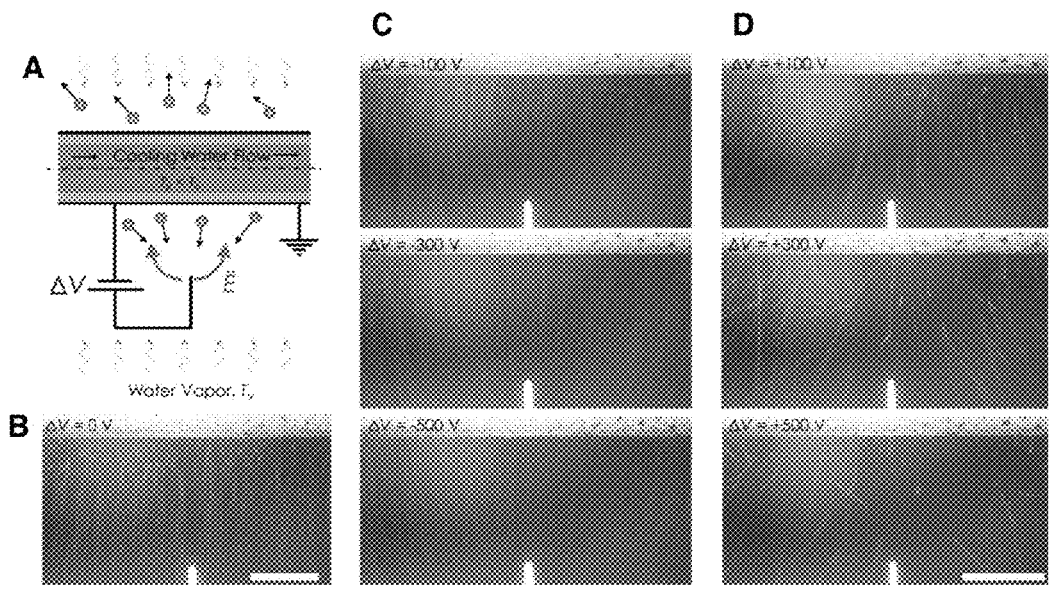
FIG. 2A is a schematic diagram of experimental setup.
FIGS. 2B-2D are a series of photographs depicting droplet interactions with an electric field.
FIG. 2E is a photograph depicting droplet removal using a strong electric filed applied between a wire electrode and the tube.
FIG. 2F is a concept schematic of the electric filed assisted droplet removal apparatus. An electrode concentric tube is placed axially aligned with the condensing tube. An electric filed is applied between the electrode tube and condensing tube in order to remove droplets towards the electrode tube.
Figure 2E:
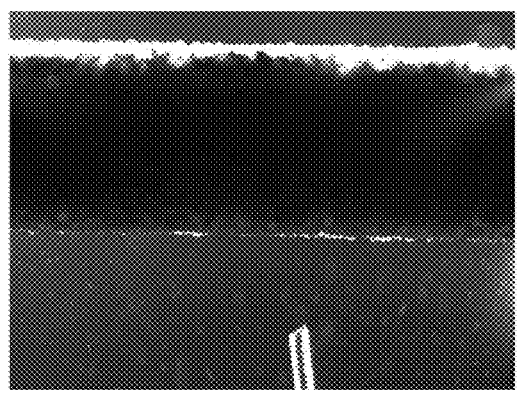
Figure 2F:
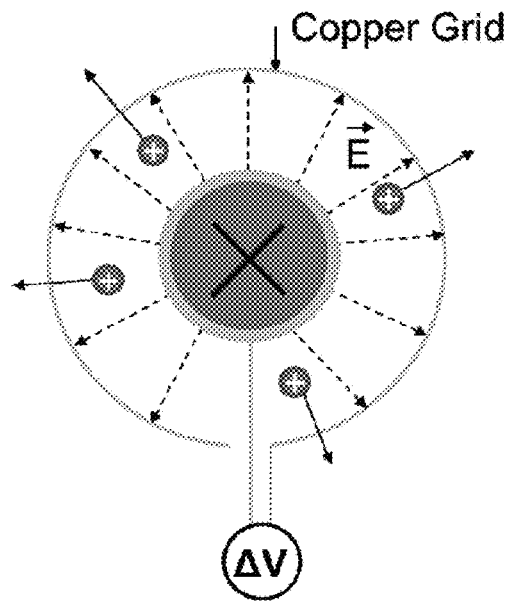

To further study the charging hypothesis and elucidate the charge polarity, the experimental setup was modified to include an electrode (FIG. 2A). The electrode was a 350 μm diameter aluminum wire, and was connected to a 600 V DC power supply (N5752A, Agilent Technologies) with the opposite terminal connected to the grounded tube sample. The electrode was placed beneath the superhydrophobic surface to allow interactions between the electrode and droplets passing under the influence of gravity. Chamber vapor pressure $P_v$=2700±68 Pa, S≈1.04. With an applied constant electrical bias (ΔV), an electric field between the electrode and grounded tube was established, creating droplet motion toward or away from the electrode depending on the polarity of the bias (negative or positive). FIG. 2B shows a long exposure image (50 ms) of droplet motion in the presence of the electrode with ΔV=0. As expected, droplet-droplet interactions were observed close to the tube sample, while no electrode-droplet interactions were apparent due to the neutrality of the electrode. However, when a negative bias was applied to the electrode (ΔV=−100, −300, −500V), significant droplet-electrode attraction was observed (FIG. 2C). To eliminate the possibility of induced electrical effects, i.e., droplet motion due to dielectrophoresis, the polarity of the electrode was reversed (ΔV=+100, +300, +500V) and a significant droplet-electrode repulsion was observed (FIG. 2D). The repulsion and attraction observed under positive and negative electrode bias, respectively, indicates that dielectrophoresis was not the cause of droplet-electrode interaction and that all of the droplets were positively charged after jumping from the surface. Although the magnitude of the droplet charge can be calculated from these electrode experiments, potential charging of the hydrophobic surface coating may arise (see Tian, C. S. & Shen, Y. R. Structure and charging of hydrophobic material/water interfaces studied by phase-sensitive sum-frequency vibrational spectroscopy. *P Natl Acad Sci USA* 106, 15148-15153, (2009), Hopkins, A. J., McFearin, C. L. & Richmond, G. L. SAMs under Water: The Impact of Ions on the Behavior of Water at Soft Hydrophobic Surfaces. *J Phys Chem C* 115, 11192-11203, (2011), each of which is incorporated by reference in its entirety), altering the voltage bias so that the magnitude of the electric field is difficult to determine. It is also important to note that, although charging may occur from the tube substrate beneath the nanostructure via flow electrification (see Touchard, G. Flow electrification of liquids. *J Electrostat* 51, 440-447, (2001), which is incorporated by reference in its entirety.), droplet charging was found to be independent of the cooling water flow rate, thus eliminating this possibility.

Figure 16:
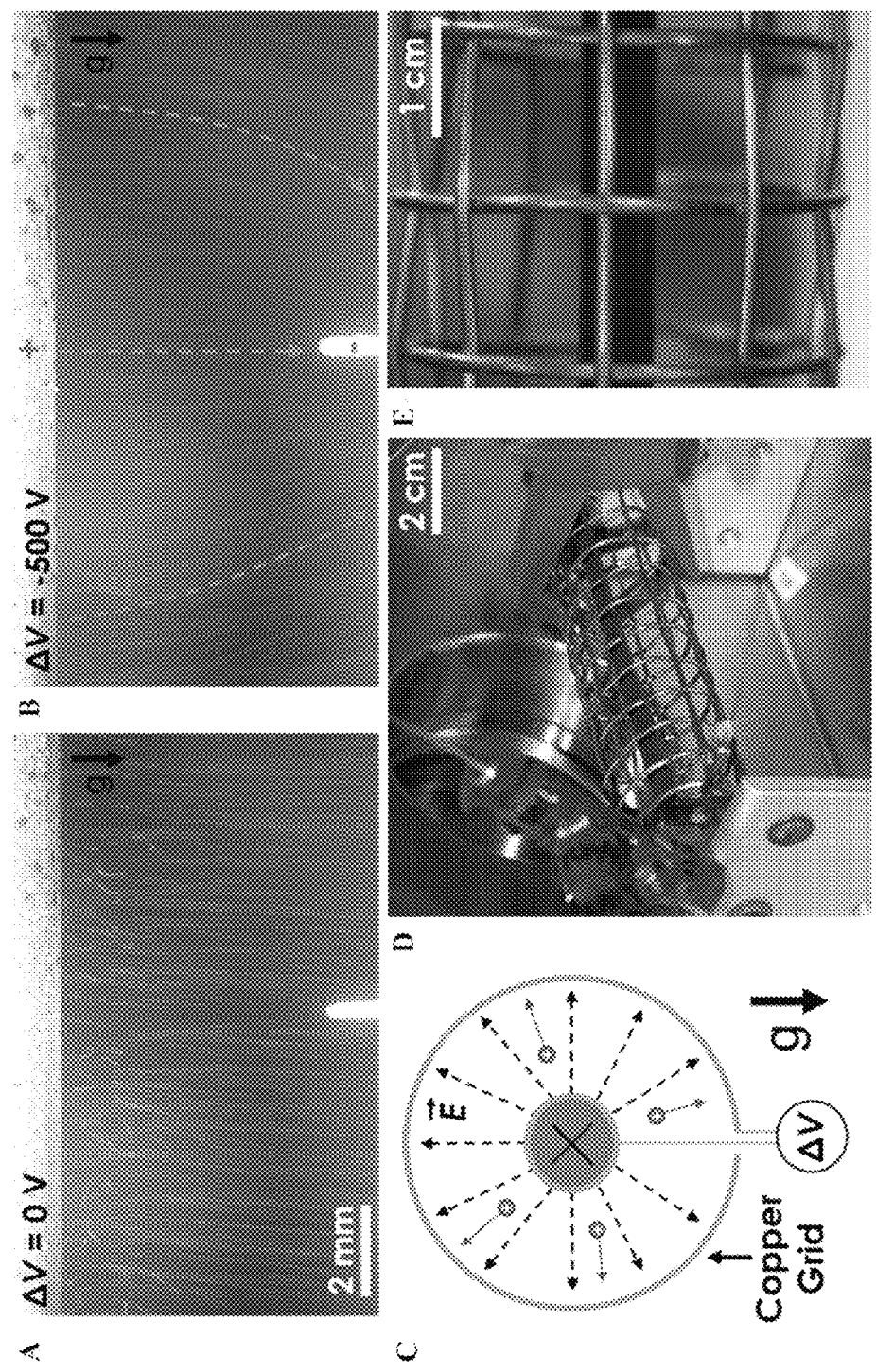
FIGS. 16A-16B are long exposure time images of electric-field-enhanced (EFE) droplet removal.
FIG. 16C is a schematic of EFE condensation.
FIGS. 16D-16E show the experimental setup for EFE condensation.

FIGS. 16A and 16B depict the EFE condensation concept, where a copper electrode placed beneath the tube was voltage biased with 0 and 500 V (electrode is negative, tube is grounded, 40 ms exposure time), respectively, to form an electric field in order to prevent the return of jumping droplets (see section S3). Under the no-field condition, droplets smaller than $R_{max}$ jumped downward and then returned to the surface, as seen by the changing trajectories in the long exposure time image (FIG. 16A, zero bias voltage). However, when the field strength was large enough, droplet reversal was completely eliminated (FIG. 16B, 500 V bias, electrode negative, tube ground, green dotted arrows represent the electric field lines) and potentially higher heat transfer could be attained due to the reduction in average droplet size distribution on the condensing surface. The image shows the concept of electric-field-enhanced (EFE) condensation with no droplet return to the surface, and significant attraction of jumping droplets away from the surface ($P_v$=2700±75 Pa, S≈1.04). See, Miljkovic, N.; Enright, R.; Wang, E. N. Effect of Droplet Morphology on Growth Dynamics and Heat Transfer during Condensation on Superhydrophobic Nanostructured Surfaces. *ACS Nano* 2012, 6, 1776-1785, Miljkovic, N.; Enright, R.; Nam, Y.; Lopez, K.; Dou, N.; Sack, J.; Wang, E. N. Jumping-Droplet-Enhanced Condensation on Scalable Superhydrophobic Nanostructured Surfaces. *Nano Lett.* 2013, 13, 179-187, Miljkovic, N.; Enright, R.; Wang, E. N. Modeling and Optimization of Superhydrophobic Condensation. *J. Heat Transf.* 2013, 135, 111004, and Rose, J. W.; Glicksman, L. R. Dropwise Condensation—The Distribution of Drop Sizes. *Int. J. Heat Mass Tran.* 1973, 16, 411-425, each of which is incorporated by reference in its entirety.

To study the effect of external electric fields, experimental setup was modified to include a copper wire cage electrode surrounding the condensing superhydrophobic CuO tube (FIGS. 16C-16E). FIG. 16C shows a schematic of EFE condensation. The outer copper grid is biased negative relative to the condensing tube, creating an electric field and attracting jumping droplets away from the surface and preventing droplet return due to vapor flow entrainment. Images of the EFE condensation experiment showing isometric (FIG. 16D) and front views (FIG. 16F) from the camera viewport. The outer copper grid is biased negative relative to the condensing tube, creating an electric field and attracting jumping droplets away from the surface. By applying a voltage between the grounded tube and wire cage, droplets jumping from the surface were attracted towards the cage and away from the surface, limiting droplet return due to entrainment.

Figure 13:
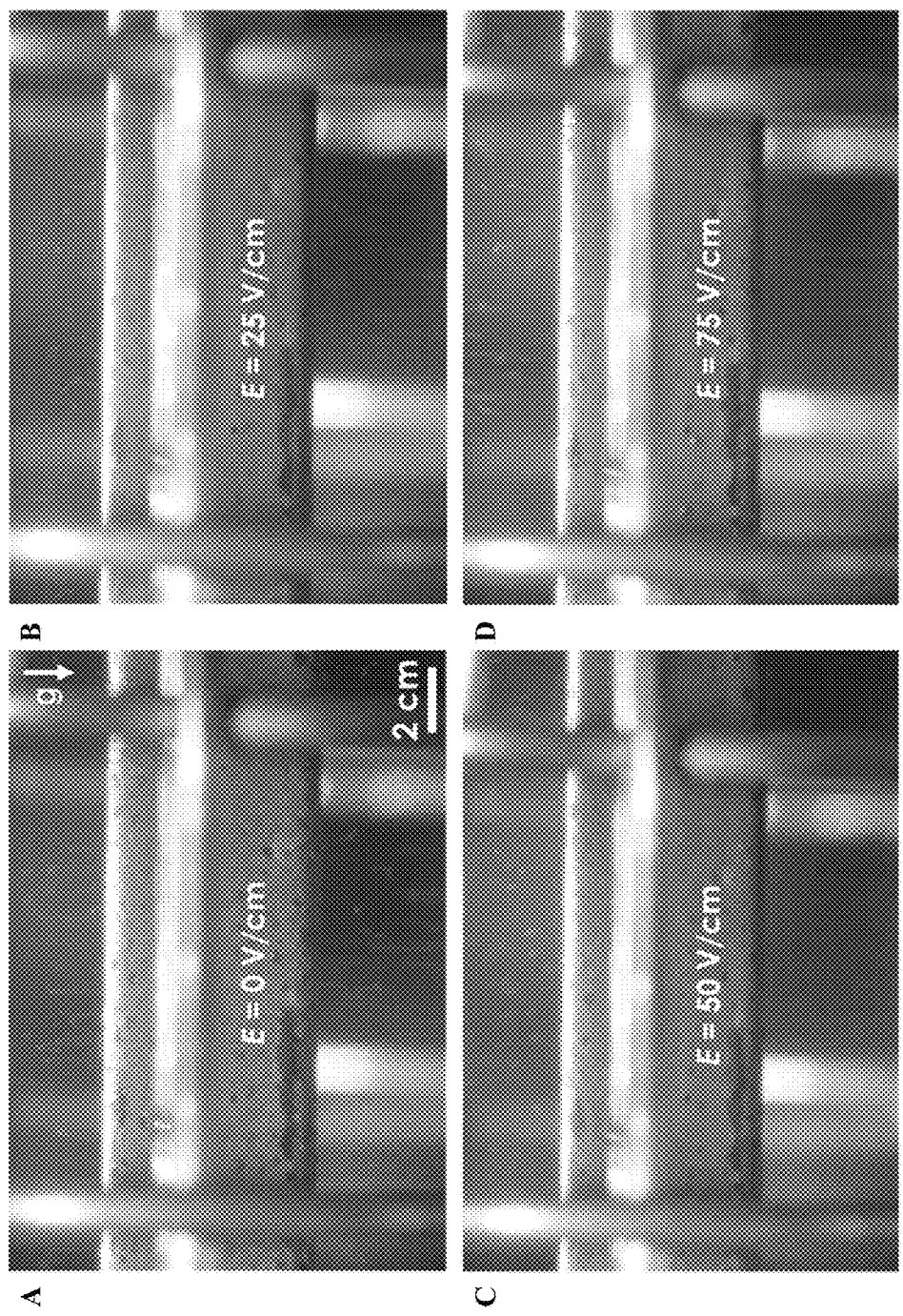
FIG. 13 are photographs depicting the electric filed enhanced condensation at electric fields. Rapid droplet removal is seen at higher voltages.

FIG. 13 shows long exposure (40 ms) time-lapse images of condensation with a positive surface voltage bias (grounded tube, negative cage). The outer copper grid (FIG. 16D-E) is biased negative relative to the condensing tube. Increasing voltage results in fewer droplets returning to the condensing tube surface. This is shown via the reduction in parabolic droplet streaks (trajectories) on the top of the tube surface from FIG. 13A to FIG. 13D. Electric fields larger than E≈75 V/cm had identical performance (all jumping droplets were removed), indicating that the critical electric field force on the droplet was reached and was large enough to overcome vapor drag at this particular heat flux. ($P_v$=2700±75 Pa, S≈1.04). Increasing voltages resulted in decreasing droplet return as shown by fewer parabolic trajectories on top of the tube surface which indicate droplets returning to the condensing surface. At low voltages ($\Delta V$<100 V), droplet return was decreased when compared to no-field condensation, but was still present (FIGS. 13A-13C). Droplet return was not eliminated until a critical voltage of $\Delta V$≈130 V was reached, corresponding to a critical electric field strength of approximately E≈$\Delta V/(R_o - R_t)$≈75 V/cm, where $R_o$ is the cage radius (≈2 cm).

To theoretically estimate the critical electric field and better understand the EFE droplet removal mechanism, the forces on a departed droplet just as it reaches the crest of its motion and is about to reverse direction ($v_y$=0, where $v_y$ is the droplet velocity) can be compared.

The gravitational force acting on the droplet can be estimated by $F_g=(4/3)\pi R^3 \rho_w g$~0.04 nN, where R is the characteristic jumping droplet radius (R~10 μm). The vapor drag force can be estimated by considering conservation of condensate vapor mass to calculate the vapor velocity $U_v \approx q''/(\rho_v h_{fg})$, where $U_v$ is the characteristic vapor flow velocity towards the tube, q″ is the characteristic heat flux (q″~0.5 W/cm²), and $h_{fg}$ is the water latent heat of vaporization ($h_{fg}$=2260 kJ/kg). By substituting values in for the experimental conditions, a characteristic water vapor velocity of $U_v$≈0.1 m/s is obtained.

To determine the characteristic drag force on the droplet due to the vapor, the Stokes flow approximation was used which is appropriate due to the low Reynolds numbers, Re, of the droplet motion. The Re=$[\rho_v U_v (2R)]/\mu_v$≈0.005, where R is the characteristic jumping droplet radius (R~10 μm). Using the Stokes approximation yields a characteristic Stokes drag, $F_{drag}=6\pi\mu_v U_v R$~0.19 nN. In order to calculate the minimum critical electric field, the difference between the characteristic Stokes drag and the gravitational force (droplet jumping downward, FIG. 15A) are equated to the force imparted by an external field on the charged droplet, $E_{crit} \approx (F_{drag}-F_g)/q$, where q is the electrostatic charge on the droplet (q≈15 fC). Substituting in the experimental values, a critical field strength of $E_{crit}$≈100 V/cm is obtained, which is in reasonable agreement with the experimentally determined critical value of ≈75 V/cm.

It is important to note, the estimated characteristic electric field in these experiments is assumed to equal the form of two uniformly spaced parallel plates, E≈$\Delta V/(R_o-R_t)$. Although a reasonable approximation, the field between the wire cage and tube is better represented by a radially depended electric field encountered between two concentric cylinders, which can be expressed as $E_r \approx \Delta V/[\ln(R_o/R_t)r]$, where r is the radial distance from the tube centerline. To estimate the accuracy of this approximation, the two limits of electric field strength was calculated (at the CuO tube surface and the copper wire mesh surface) and found, $35.3 < E_r < 222.5$ V/cm, which bounds the estimated critical electric field of $E \approx \Delta V/(R_o - R_t) \approx 75$ V/cm.

Figure 17:
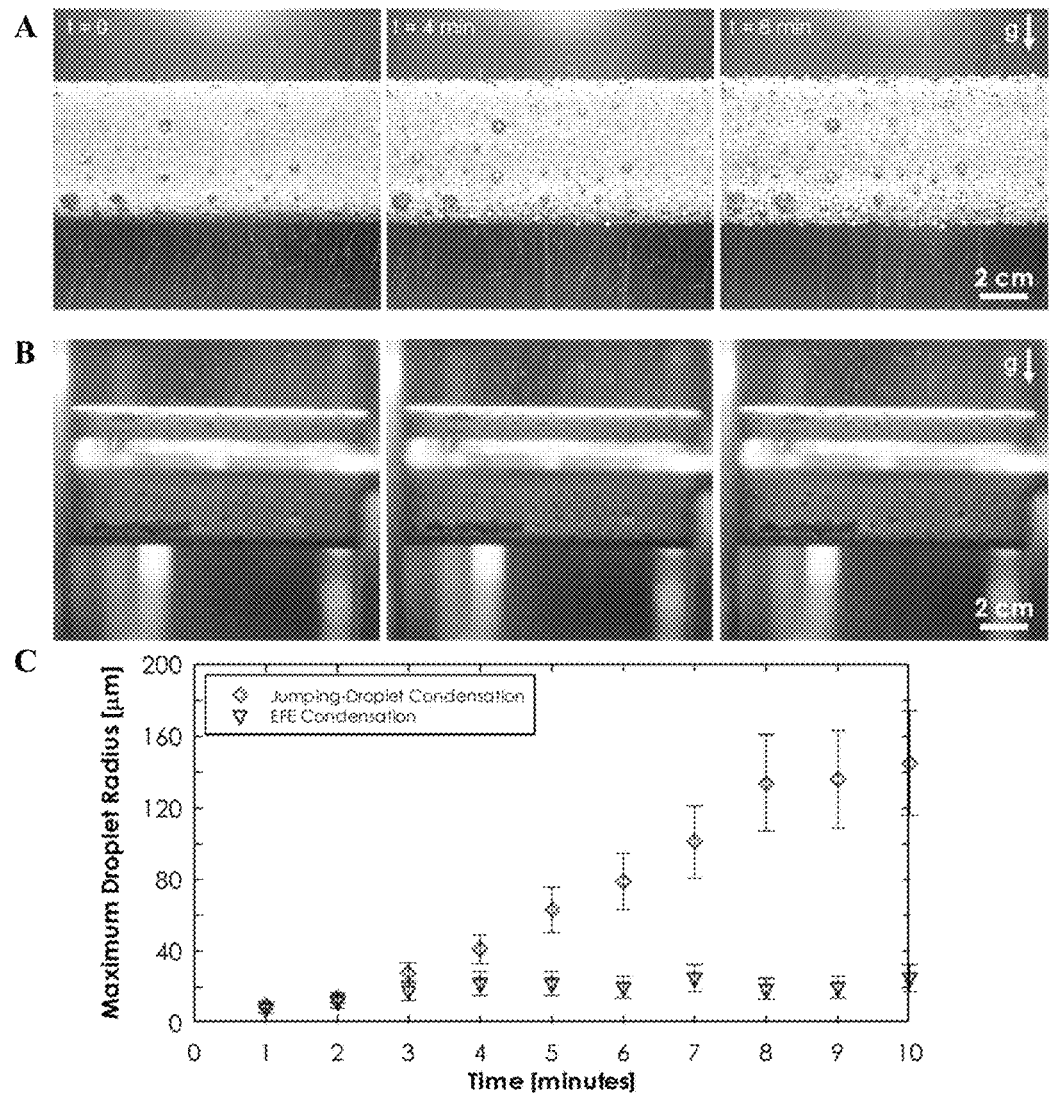
FIG. 17A is time-lapse images of steady state jumping-droplet condensation.
FIG. 17B is time-lapse images of steady state EFE condensation.
FIG. 17C is a graph depicting maximum droplet radius on the condensing surface as a function of time for jumping-droplet and EFE condensation.

FIGS. 17A and 17B show long exposure (40 ms) time-lapse images of no-field and EFE condensation, respectively ($P_v = 2700 \pm 75$ Pa, $S \approx 1.04$). Jumping-droplet condensation with no electric field shows significant droplet return to the surface due to vapor flow entrainment. As droplets return, some may coalesce and jump again, while others may remain pinned to the surface. As the condensation time approached 8 minutes, the no-field jumping-droplet condensation mode (FIG. 17A) had a larger population of pinned liquid droplets on the surface. Although droplet jumping was still present at later times (t>10 minutes), progressive flooding of the surface due to return of departing droplets from vapor flow entrainment created a larger average droplet size ($R_{max,no-field} \approx 145 \pm 29$ μm, FIG. 17C). In contrast to no-field droplet jumping, the EFE condensing mode (FIG. 17B) showed little increase in average droplet size on the surface through the experiment ($R_{max,EFE} < 25 \pm 8$ μm, FIG. 17C). This observation implies that EFE condensation provides a means to further increase jumping-droplet heat transfer by minimizing the average droplet size and increasing the population of small droplets on the surface which are more effective at transferring heat during condensation.

It is important to note that although charged jumping droplets feel an attractive Coulombic force towards the tube at all times (due to opposite charge left on the hydrophobic coating), the magnitude of the force is negligible compared to the drag force at the length scales (~1 mm) of droplet deceleration and reversal. See, Miljkovic, N.; Preston, D. J.; Enright, R.; Wang, E. N. Electrostatic Charging of Jumping Droplets. *Nat. Commun.* 2013, 4, 2517, doi:10.1038/ncomms3517, which is incorporated by reference in its entirety. In addition, the progressive flooding mechanism is distinct from the nucleation-density-mediated flooding mechanism (see section S10). Nucleation-density-mediated flooding occurs due to nucleation site activation (at elevated supersaturations, S>1.12), droplet coalescence within the structure, and filling of the structure with condensate. Progressive flooding occurs due to the progressive return of jumping droplets back to the surface due to vapor flow entrainment and gravity. These returning droplets do not necessarily jump again and remain adhered to the surface in a partially wetting (Cassie type) morphology, increasing the time average droplet size and degrading overall heat transfer performance.

Figure 3:
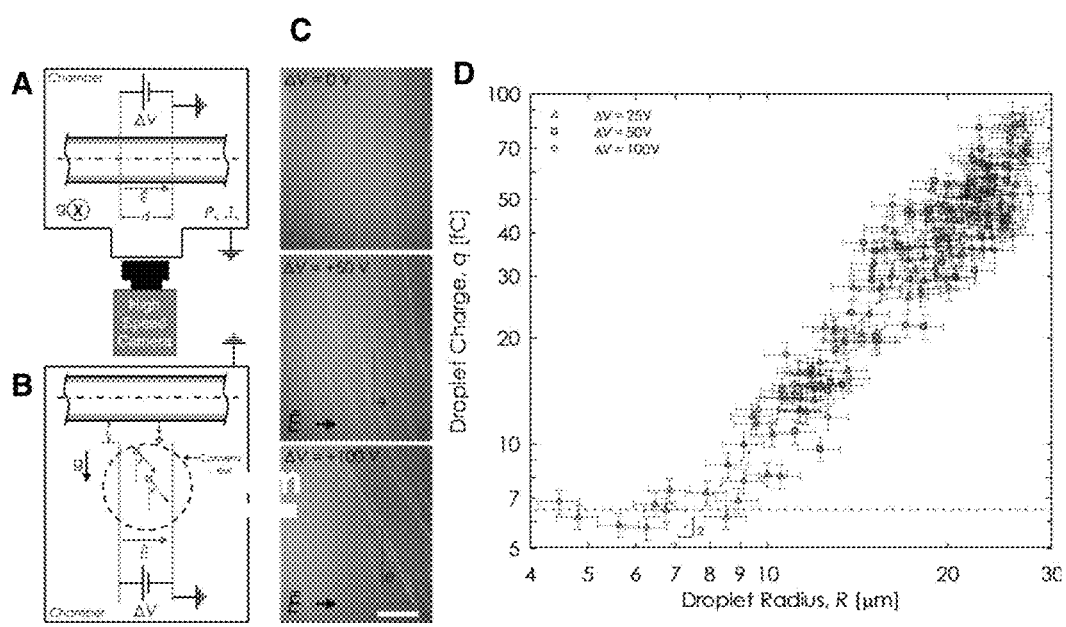
FIGS. 3A-3B are schematic diagrams of experimental setup.
FIG. 3C is a series of photographs depicting droplet deflection.
FIG. 3D is a graph depicting experimental individual droplet charge (q) as a function of departing droplet radius (R) for uniform electric fields.

To better control the electric field, an approach similar to that of Millikan was adapted (*Physical Review*, 1913) whereby external parallel plates were used to create a uniform field. FIGS. 3A and 3B show top and side view schematics of the modified experimental setup, respectively (see section S5). Two polished copper plates (10×20 cm, Alloy 110, McMaster-Carr) were placed L=10±0.05 mm beneath the tube and spaced d=19±0.05 mm apart. The left plate (FIG. 3B) was grounded while the right plate was connected to the power supply. Control of the voltage bias and plate spacing allowed for accurate calculation of the magnitude and direction of the electric field ($\bar{E} = \Delta V/d$). A high speed camera was mounted adjacent to the parallel plates to record the droplet motion between the plates. The camera was mounted ≈20 mm below the top of the plates to avoid non-parallel field edge effects and to allow droplets to reach terminal velocity prior to entering the field of view of the camera. FIG. 3C shows long exposure images (33 ms) of the droplet trajectory under applied electric fields of $\bar{E} = \Delta V/d = 1.31$, 2.63 and 5.26 kV/m (right plate is grounded) for the CuO superhydrophobic surface (FIG. 1A). The images show that 1) the droplet deflection θ was dependent on the electric field, and 2) for each applied field, the deflection angle θ was constant, indicating terminal velocity was reached. Droplets traveling at terminal velocity were analyzed in terms of the forces in the x (horizontal) and y (vertical) directions. A charged droplet at terminal velocity experiences a force in the x-direction of $\Sigma F_x = 0 = -F_D \cdot \cos \theta + q \cdot E$, and in the y-direction of $\Sigma F_y = 0 = F_D \cdot \sin \theta + (\rho_v - \rho_w) \cdot V \cdot g$, where $F_D$ is the drag force, θ is the angle between the droplet trajectory and the vertical, q is the charge on the droplet, $\rho_v$ and $\rho_w$ are the water vapor and liquid water densities, respectively, V is the droplet volume ($V = (4/3) \cdot \pi R^3$), and g is the gravitational constant (see, section S4). The ratio of the two force components yields the trajectory equation $q/[(\rho_v - \rho_w) \cdot V \cdot g] = (g/\bar{E}) \cdot \tan \theta$.

Figure 4:
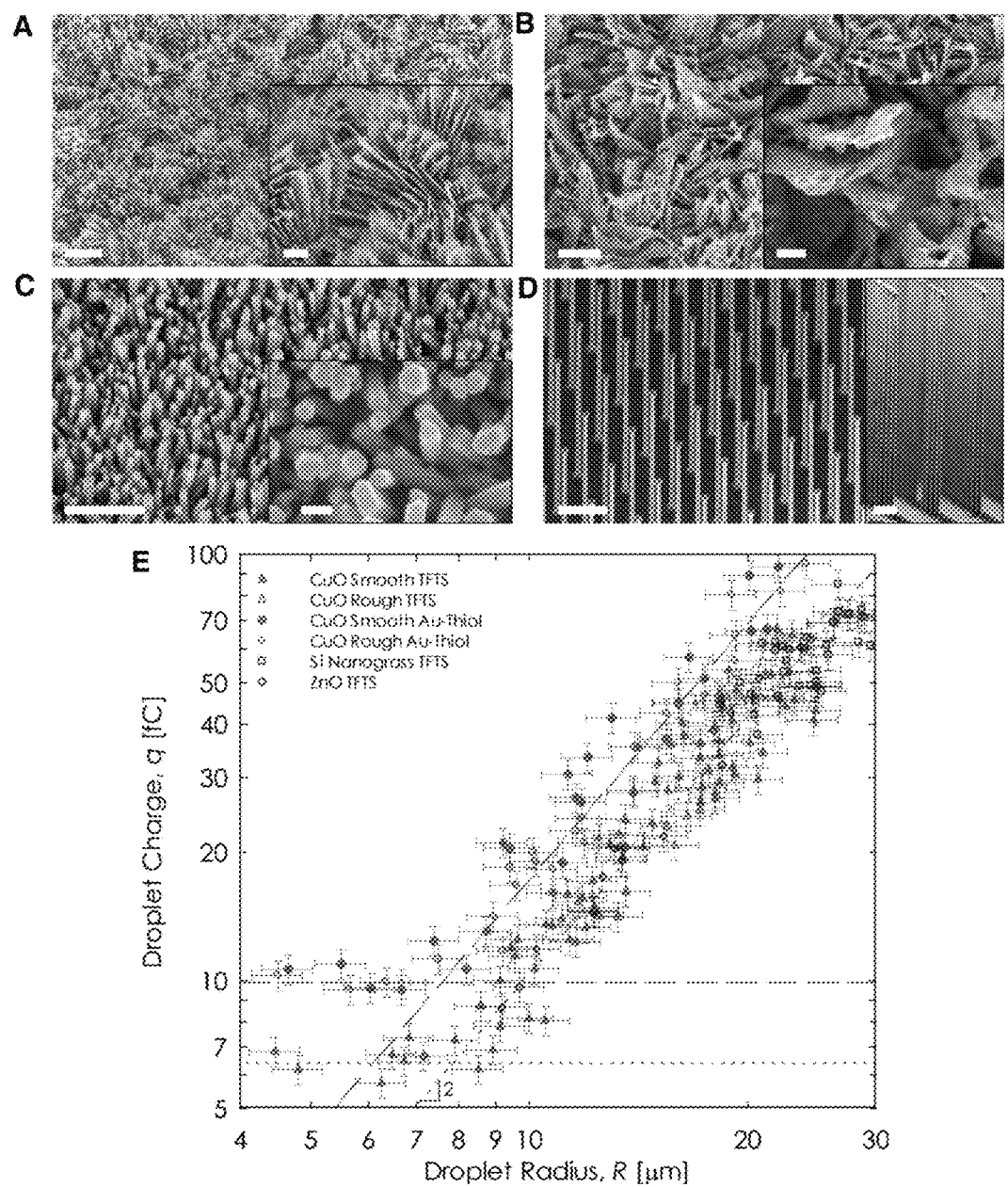
FIGS. 4A-4D are a series a scanning electron micrographs depicting individual droplet charge as a function of droplet radius, electric field strength and condensing surface.
FIG. 4E is a graph of the experimental individual droplet charge (q) as a function of departing droplet radius (R) for the structures shown in FIGS. 4A-4D.

FIG. 3D shows droplet charge as a function of droplet diameter on the CuO superhydrophobic surface for the three different field strengths ($\bar{E} = 1.31$, 2.63 and 5.26 kV/m). The results show that there are two regimes: 1) For smaller radii ($R \gtrsim 7$ μm), the droplet charge was independent of the surface area ($\sim R^0$). This behavior can be explained by examining the droplet growth prior to coalescence. Droplets growing on the superhydrophobic surface first nucleate within a structure unit cell, i.e., area between the structures, eventually emerging from the unit cell to grow up and above the structures with a constant basal area (see Miljkovic, *Nano Lett*, 2013 & Enright, *Langmuir*, 2012). Throughout this growth, the interfacial area between the structured surface and liquid droplet remains relatively constant since the droplet grows primarily by increasing its contact angle and forming a more spherical shape (see Enright, *Langmuir*, 2012), resulting in a constant electrostatic charge. 2) For large radii ($R \gtrsim 7$ μm) the charge is droplet surface area dependent ($\sim R^2$) and is equal to q"=7.8±3.6 μC/m². This dependency on surface area indicates that the charging mechanism of droplets is associated with the interfacial area between the condensing droplets and the hydrophobic surface beneath them when the growth phase enters the period of constant contact angle with increasing basal area expanding over the tips of the surface structures (see Miljkovic, *Nano Lett*, 2013). Furthermore, the results show that droplet charging was independent of the electric field strength, indicating that induced electrification or dielectrophoretic effects were not factors in the experiment. To further elucidate the potential mechanism of the droplet charging, superhydrophobic surfaces were fabricated spanning a range of length scales (~10 nm-1 μm) and materials including CuO, zinc oxide (ZnO), and silicon nanopillars (Si), shown in FIGS. 4A-4D (see Methods). FIGS. 4A-4D are scanning electron micrographs of the tested surfaces including CuO metal oxide coated with TFTS (FIG. 4A), scale bar is 2 μm (Inset: High resolution image of the CuO-TFTS. Scale bar is 400 nm), CuO metal oxide coated with thiol (FIG. 4B), scale bar is 1 μm (Inset: High resolution image of the CuO-thiol. Scale bar is 200 nm), ZnO metal oxide coated with TFTS (FIG. 4C), scale bar is 400 nm (Inset: High resolution image of the ZnO-TFTS. Scale bar is 60 nm), and silicon nanopillars coated with TFTS (FIG. 4D), scale bar is 2 μm (Inset: High resolution image of the Si nanopillar-TFTS. Scale bar is 1 μm). To study the effects of the interfacial droplet-surface contact, the surfaces were functionalized with a variety of hydrophobic coatings, including thiol and TFTS (see Methods). Furthermore, to vary the effects of macroscale roughness and hierarchy, the CuO nanostructured surfaces were created using smooth and rough Cu substrates having macroscale surface asperities on the order of ~10 nm and ~5 μm, respectively (see, section S5). FIG. 4E shows the droplet charge q as a function of droplet radius R for all of the surfaces tested. Surfaces with identical coatings, i.e., CuO Smooth TFTS, CuO Rough TFTS, ZnO TFTS, Si TFTS, showed identical charge trends (q"=7.8±3.6 μC/m$^2$) irrespective of the surface structure or surface finish. However, surfaces with differing coatings, i.e., CuO thiol and CuO TFTS, showed that charging was dependent on the hydrophobic coating ($q_{thiol}$"=12.6±2.6 μC/m$^2$, $q_{TFTS}$"=7.8±3.6 μC/m$^2$). This dependence of the coating indicates that the charging of the jumping droplets occurs at the solid-liquid interface, rather than after departing from the surface. Dashed-green and dotted-red lines represent fits for the thiol and TFTS coating data, respectively. Error bars denote the propagation of error associated with the high speed camera resolution and the calculation of droplet size from terminal velocity obtained from high speed image processing. The spread in the experimental data is expected because the droplet coalescence can occur between two different size droplets as well as between multiple droplets (Chamber vapor pressure $P_v$=2700±68 Pa, S≈1.04).

Based on these results, a charge separation mechanism can be governed by the critical time scale associated with the droplet coalescence. It is well-known that most hydrophobic coatings have a negative zeta potential. In the presence of liquid water, these surfaces tend to adsorb negative charge and form an electric double layer in the fluid. Although the water used in these experiments is deionized, the dissociation of water molecules into their HO$^-$ and H$^+$ constituents continues in equilibrium. See, McCarty, L. S. & Whitesides, G. M. Electrostatic charging due to separation of ions at interfaces: Contact electrification of ionic electrets. *Angew Chem Int Edit* 47, 2188-2207, (2008), which is incorporated by reference in its entirety. As water droplets nucleate and grow on the superhydrophobic surface, OH$^-$ ions transport to the coating and preferentially adsorb to the surface, forming a diffuse double layer at the coating surface inside the nanostructure unit cell (See Tian, *PNAS*, 2009). If the droplet is removed fast enough (coalescence and jumping), charge separation can occur, resulting in H$^+$ accumulation inside the jumping droplet. However, if the droplet is removed slowly, the motion of the contact line and subsequent accumulation of H$^+$ in the droplet will create a counter electric field, accelerating the desorption of the OH$^-$ ions and ensuring net neutrality of the removed droplet. To gain a better understanding of these dynamic processes, the time scales associated with each (coalescence, diffusion, and electrophoresis) are considered. For the droplet radii ≳2 μm, the coalescence time scale is governed by a capillary inertial scaling, $\tau_c \sim [\rho_w \cdot R^3/\sigma]^{1/2}$. See Eggers, J., Lister, J. R. & Stone, H. A. Coalescence of liquid drops. *J Fluid Mech* 401, 293-310, (1999), Paulsen, J. D., Burton, J. C. & Nagel, S. R. Viscous to Inertial Crossover in Liquid Drop Coalescence. *Phys Rev Lett* 106, (2011), Wu, M. M., Cubaud, T. & Ho, C. M. Scaling law in liquid drop coalescence driven by surface tension. *Phys Fluids* 16, L51-L54, (2004), each of which is incorporated by reference in its entirety. The time scales for charge transport from the hydrophobic coating to the droplet bulk can be characterized by two separate mechanisms, diffusion of the desorbed ion through the liquid residing in the structure $\tau_d \sim h/[2 \cdot (D_{H+})^{1/2}]_2$ (see Wraight, C. A. Chance and design—Proton transfer in water, channels and bioenergetic proteins. *Bba-Bioenergetics* 1757, 886-912, (2006), which is incorporated by reference in its entirety.) and electrophoresis of the desorbed ion due to the formation of the counter electric field[21] $\tau_e \sim h/[\bar{E} \cdot \mu_{e,H+}]$, where h is the characteristic structure height, $D_{H+}$ is the diffusivity of the H$^+$ ion, $\mu_{e,H+}$ is the combined electrophoretic and electroosmotic mobility of the H$^+$ ion, and $\bar{E}$ is the magnitude of the counter electric field. H$^+$ was chosen as the ion for analysis due to its higher diffusivity and mobility when compared to OH$^-$, allowing for a conservative estimate of the critical time scales. As mentioned previously, if the time scale of the coalescence process is too fast, insufficient time is allotted for OH$^-$ desorption and subsequent transport to the droplet bulk before it jumps. Comparing the characteristic time scales shows that $\tau_c/\tau_d$≪1 and $\tau_c/\tau_e$≪1 for the entire range of measured droplet charge (2 μm<R<40 μm, see, section S6), suggesting that, although a counter electric field develops at the rapidly moving contact line during coalescence, the time needed for OH$^-$ desorption and transport to the droplet bulk is not sufficient, leaving OH$^-$ adsorbed to the surface while resulting in a positively charged jumping droplet. To support the proposed charge separation mechanism, the effective zeta potential of the charged surfaces was determined with these measurements. The zeta potential of the thiol and TFTS surfaces was determined to be $\zeta_{thiol}$≈−84 mV and $\zeta_{TFTS}$≈−56 mV, respectively (see, section S7). These values are reasonable estimates considering most fluoropolymer coatings have typical zeta potentials in the range of −25 to −85 mV. See McCarty, *Angew Chem Int Edit*, 2008.

Heat Transfer Theory and Experiments

Figure 14:
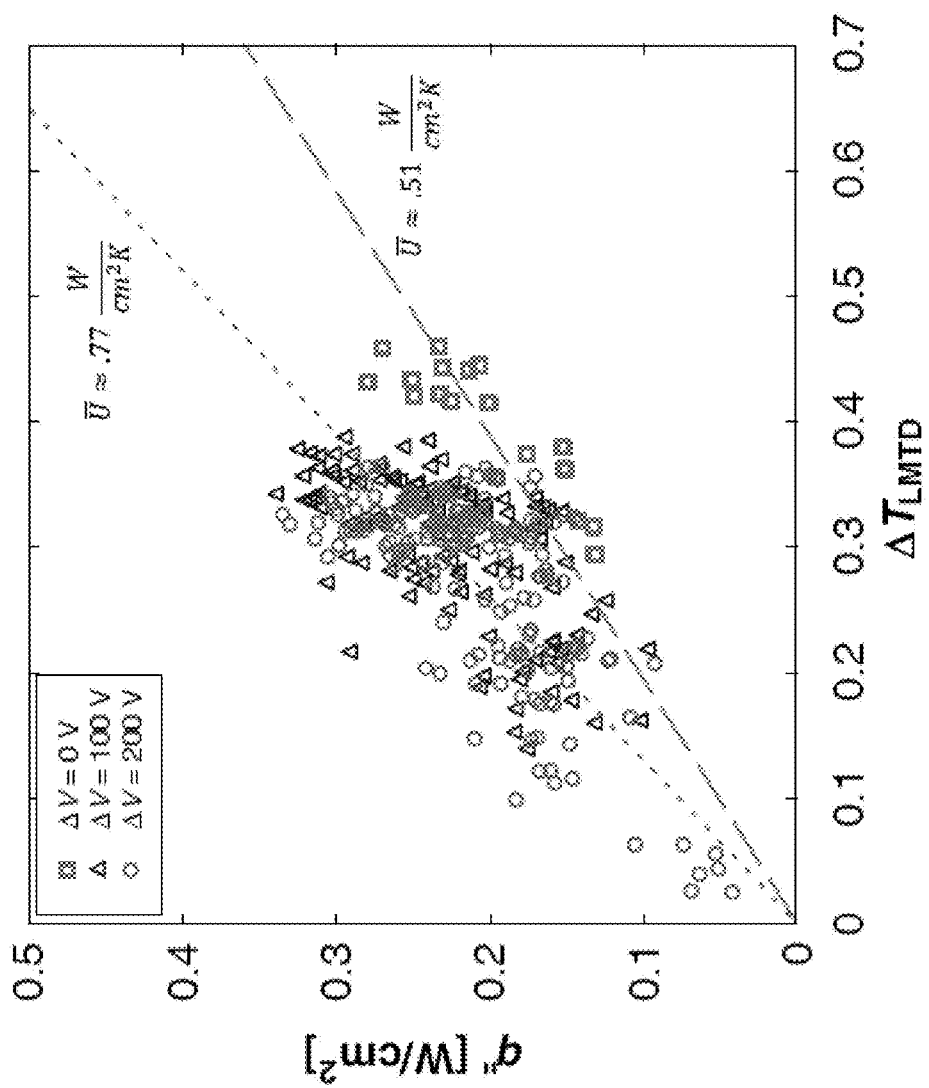
FIG. 14 is a graph depicting heat transfer performance as a function of supersaturation and electric field strength. (a) Experimental steady state heat flux (q″) as a function of log mean water-to-vapor temperature difference ($\Delta T_{LMTD}$) for tube surfaces undergoing jumping condensation and EFE condensation (CuO chemical oxidation time τ=10 minutes, chamber vapor pressure $P_v$=2700±68 Pa, 1.02<S≤1.6). Rapid droplet removal and reduction of droplet return due to the external electric field results in the highest heat fluxes for the EFE jumping samples (S<1.12). However, flooding of the surface at higher heat fluxes resulted in rapid performance degradation and transition into the flooded condensation mode (S>1.12). The dotted lines represent curves of best fit to the data. Error bars associated with the measurement are $Error_{\Delta T}\approx\pm0.1$, $Error_{q''}\approx\pm0.1$ (not plotted for clarity).

To quantify the effect of eliminating droplet return and increasing droplet removal rates with EFE condensation, the overall heat transfer coefficients (U) for varying electric fields (ΔV=0, 100, and 200 V) were measured. FIG. 14 shows the overall surface heat flux as a function of the log-mean-temperature-difference ($\Delta T_{LMTD}$) between the saturated vapor and cooling water. Experiments were run at relatively low cooling water flow rates of 1.5±0.03 LPM in order to increase the temperature difference from inlet to outlet and obtain a greater signal to noise ratio. Reducing the flow rate, however, led to relatively low overall heat transfer coefficients due to the larger convective resistance on the coolant side.

FIG. 14 shows that for the case of no electric field, the overall heat transfer coefficient was approximately ≈0.51 W/cm$^2$·K, however once the electric field was applied with ΔV=100V or 200V, the heat transfer coefficient increased by approximately 50% to 0.77 W/cm$^2$·K. At higher supersaturations (S>1.12), flooding of the surface remained independent of field strength. The independence of field strength indicates that above 100 V, the electric field cannot remove more droplets. This result is in accordance with theory since the electric field can only act on droplets once they have attained an electrostatic charge by coalescing and leaving the surface. The field strengths are not strong enough to remove droplets from the surface independent of coalescence and jumping.

Figure 18:
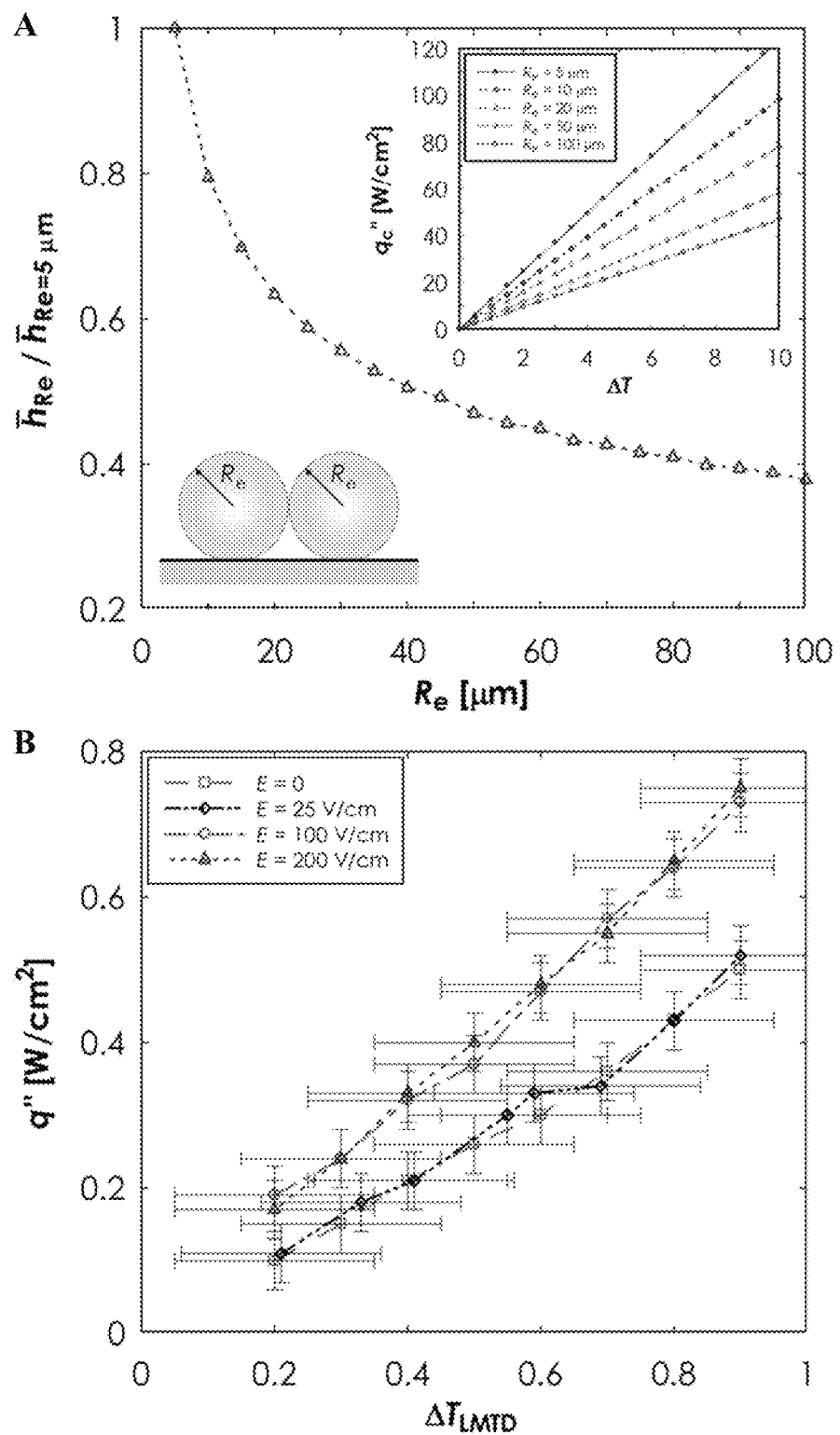
FIG. 18A is a graph depicting theoretical condensation heat transfer coefficient ratio ($h_{Re}/h_{Re=5\mu m}$) of a surface undergoing jumping-droplet condensation as a function of droplet departure radius $R_e$.
FIG. 18B is a graph depicting experimental steady state overall surface heat flux (q″) as a function of log mean water-to-vapor temperature difference ($\Delta T_{LMTD}$) for tube surfaces undergoing jumping-droplet condensation and EFE condensation.

To study the impact of the gradual increase in average droplet size on the condensing surface, i.e., progressive flooding, the previously developed model that incorporates thermal resistance-based droplet growth, the emergent droplet wetting morphology, and droplet distribution theory was used (see section S11). FIG. 18A shows the normalized condensation heat transfer coefficient ($\bar{h}_{Re}/\bar{h}_{Re=5\mu m}$) as a function of maximum droplet departure diameter, $R_e$. The normalization factor is a condensation heat transfer coefficient for a jumping droplet surface with a departure diameter of $R_e$=5 μm, which serves as an upper bound for heat transfer performance from previously observed experiments where the minimum droplet departure size on the CuO nanostructures is ≈5 μm. As the droplet departure radius increased, the condensation heat transfer degraded (FIG.

18A inset) due to the presence of larger droplets on the surface whose growth are heat conduction limited. The results show that increasing the departure size from $R_e$=5 μm to $R_e$=10 μm degraded the condensation performance by as much as 20%, indicating the importance of eliminating progressive flooding and droplet return for optimum performance.

To experimentally quantify the effect of eliminating droplet return and progressive flooding, the overall heat transfer coefficient ($\bar{U}$) was measured for varying electric fields (E=0, 100, and 200 V/cm) (see section S1). FIG. 18B shows the overall surface heat flux as a function of the log-mean-temperature-difference ($\Delta T_{LMTD}$) between the saturated vapor and cooling water. Relatively low cooling water flow rates of 0.5±0.025 L/min were used in the experiments to increase the temperature difference from inlet to outlet and obtain a greater signal to noise ratio. However, reducing the flow rate led to relatively low overall heat transfer coefficients due to the larger convective resistance on the coolant side.

FIG. 18B shows experimental steady state overall surface heat flux (q") as a function of log mean water-to-vapor temperature difference ($\Delta T_{LMTD}$) for tube surfaces undergoing jumping-droplet condensation and EFE condensation (CuO chemical oxidation time τ=10 minutes, chamber vapor pressure $P_v$=2700±68 Pa, 1.02<S≤1.04, chilled water flow rate inside the tube ≈0.5±0.025 L/min). Faster droplet removal and reduction of droplet return when an external electric field larger than the critical electric field resulted in the highest heat fluxes for the EFE jumping samples. Error bars denote the propagation of error associated with the inlet-to-outlet cooling fluid temperature difference (±0.08° C.), mass flow rate (±5%) and pressure (±2.5%). For the case of no electric field, the overall heat transfer coefficient was approximately ≈0.51±0.14 W/cm²·K. However, by applying electric fields of E=100 V/cm and 200 V/cm, the heat transfer coefficient increased by approximately 50% to 0.77±0.12 W/cm²·K for both cases. The independence of heat transfer performance on electric field strength (100 or 200 V/cm) was consistent with exceeding the critical field strength (E≈75 V/cm), which resulted in efficient removal of all jumping droplets. Note that the no-field overall heat transfer coefficient is lower than the value previously reported ($\bar{U}_{jumping}$=1.65±0.22 W/cm²·K)[48] due to the lower internal cooling water flow rate used in these experiments in order to achieve a larger inlet-to-outlet temperature difference and signal to noise ratio. In addition, higher condensation heat fluxes (S>1.04, q">1 W/cm²) were not studied in order to minimize the effect of progressive flooding due to vapor flow entrainment (which occurred during no-field jumping-droplet condensation, see section S10) and allow for a direct comparison between jumping-droplet condensation with and without an external electric field. Furthermore, at higher supersaturations (S>1.12, q">8 W/cm²) for EFE condensation, nucleation-density-mediated flooding of the surface remained, as previously observed on superhydrophobic CuO surfaces. The nucleation-density-mediated flooding mechanism was found to be independent of the electric field strength, which indicates that, for the voltage range explored, electric fields cannot remove more droplets than would have already departed. This result agrees well with theory since the electric field can only act on droplets once they have attained an electrostatic charge by coalescing and leaving the surface. This result is in contrast to the progressive flooding mechanism, which is governed by vapor entrainment and is sensitive to both the condensation heat flux (tube inlet-to-outlet temperature difference), and electric field strength. The larger the tube inlet-to-outlet temperature difference, the higher the condensation heat flux, and the larger the vapor flow rate and entrainment of jumping droplets. To counter the larger entrainment force, a larger electric field should be applied to limit droplet return to the surface.

The outcomes of this work support the findings that vapor flow entrainment is a performance limiting phenomena during jumping-droplet condensation and that efficient droplet removal is critical in realizing enhanced condensation heat and mass transfer over state-of-the-art dropwise condensing surfaces. The experimental results suggest that, although EFE condensation on superhydrophobic surfaces has the ability to enhance condensation performance, these surfaces cannot currently be used for high heat flux applications due to nucleation-density-mediated flooding of the surface.

In the future, it would be interesting to investigate different surface geometries with uniform vapor flow velocities (i.e., flat plate heat exchangers) to identify optimum EFE condenser designs. In addition, alternate methods of creating electric fields via positively biased embedded electrodes beneath the condensing surface (which would repel jumping droplets as opposed to attracting them with an external electrode) promise to be attractive alternatives to using external electrodes to prevent potential condensate bridging (short-circuiting). See, Lee, S. J.; Lee, S.; Kang, K. H. Jumping of a Droplet on a Superhydrophobic Surface in AC Electrowetting. *J. Visual.-Japan* 2011, 14, 259-264, which is incorporated by reference in its entirety. Furthermore, although not studied here, condensate management and recycling after reaching the external electrode needs to be considered. Two potential methods involve: a) the use of highly wettable wicking electrode materials (i.e. a porous copper grid) which can transport the condensate towards the tube ends to a condensate reservoir where it can be recycled and b) the use of geometry (i.e., the condensing surface and electrode are parallel vertical plates) such that gravitational removal of the condensate from the electrode could be achieved. See, Xiao, R.; Wang, E. N. Microscale Liquid Dynamics and the Effect on Macroscale Propagation in Pillar Arrays. *Langmuir* 2011, 27, 10360-10364, Xiao, R.; Enright, R.; Wang, E. N. Prediction and Optimization of Liquid Propagation in Micropillar Arrays. *Langmuir* 2010, 26, 15070-15075, Peters, T. B.; McCarthy, M.; Allison, J.; Dominguez-Espinosa, F. A.; Jenicek, D.; Kariya, H. A.; Staats, W. L.; Brisson, J. G.; Lang, J. H.; Wang, E. N. Design of an Integrated Loop Heat Pipe Air-Cooled Heat Exchanger for High Performance Electronics. *IEEE T. Comp. Pack. Man.* 2012, 2, 1637-1648, and Faghri, A. *Heat Pipe Science and Technology.* 2nd ed.; Global Digital Press: Columbia, Mo., 2010, each of which is incorporated by reference in its entirety.

In summary, the vapor drag towards the condensing surface acts as a barrier to heat transfer performance of superhydrophobic surfaces with jumping droplets. The entrainment and return of jumping droplets result in the progressive flooding of the condensing surface that is characterized by the gradual increase in average droplet size and gradual deterioration of condensation heat transfer performance. To counteract the vapor drag, droplet charging in conjunction with external electric fields demonstrates a new mode of condensation called electric-field-enhanced (EFE) condensation. As a result, 50% higher overall heat transfer coefficients were obtained at electric fields of 100 and 200 V/cm compared to typical (no-field) jumping-droplet surfaces. At high supersaturations (S>1.12), however, nucleation-density-mediated flooding of the nanostructured surfaces still led to the formation of highly pinned droplets, which degraded the condensation heat transfer coefficient. These results provide guidelines for the fabrication of high performance nanostructured CuO surfaces for moderate condensation heat flux applications.

This method offers new opportunities for a wide variety of possible applications such as the use of external electric fields to control the jumping frequency from the surface to increase condensation heat transfer, enhance anti-icing, improve self-cleaning performance, and enhance thermal diode efficiency (see Boreyko, J. B., Zhao, Y. J. & Chen, C. H. Planar jumping-drop thermal diodes. *Appl Phys Lett* 99, (2011), which is incorporated by reference in its entirety). Furthermore, by providing a relative measure of the charge adsorption, a new metrology can be developed to characterize the electrokinetic properties, such as the zeta potential, of hydrophobic materials and coatings on large scale surfaces. See, Clogston, J. D. & Patri, A. K. Zeta Potential Measurement. *Methods Mol Biol* 697, 63-70, (2011), which is incorporated by reference in its entirety.

Methods

Fabrication.

To create the CuO nanostructures, commercially available oxygen-free Cu tubes were used (99.9% purity) with outer diameters, $D_{OD}$=6.35 mm, inner diameters, $D_{ID}$=3.56 mm, and lengths, L=131 mm, as the test samples for the experiments. Each Cu tube was cleaned in an ultrasonic bath with acetone for 10 minutes and rinsed with ethanol, isopropyl alcohol and de-ionized (DI) water. The tubes were then dipped into a 2.0 M hydrochloric acid solution for 10 minutes to remove the native oxide film on the surface, then triple-rinsed with DI water and dried with clean nitrogen gas. Nanostructured CuO films were formed by immersing the cleaned tubes (with ends capped) into a hot (96±3° C.) alkaline solution composed of $NaClO_2$, NaOH, $Na_3PO_4.12H_2O$, and DI water (3.75:5:10:100 wt. %)[24]. During the oxidation process, a thin ($\approx$300 nm) $Cu_2O$ layer was formed that then re-oxidized to form sharp, knife-like CuO oxide structures with heights of h$\approx$1 µm, solid fraction $\varphi \approx$0.023 and roughness factor r$\approx$10 (FIG. 1A).

The ZnO nanowires with diameters of d$\approx$40 nm, heights h$\approx$350 nm and center-to-center spacings of l$\approx$100 nm (solid fraction $\varphi=\pi d^2/4l^2 \approx$0.056 and roughness factor $r=1+\pi dh/l^2 \approx$2.95), were synthesized in solution according to the procedures of Greene and Pacholski[25]. In order to synthesize ZnO seed crystals, 0.01 M of zinc acetate dihydrate (Sigma-Aldrich, ACS reagent, ≥99.0%) and 0.03 M of sodium hydroxide (Sigma-Aldrich, ACS reagent, ≥98.0%) in methanol were mixed and stirred at 60° C. for 2 hours. The resulting solution was used to create ZnO seed crystals onto desired substrates by drop-coating, followed by rinsing with methanol and blow-drying with a weak stream of nitrogen. This drop-coating process was repeated five times. The ZnO seed crystals were then bonded by annealing the substrate at 350° C. for 20 min in air. Hydrothermal growth of the ZnO nanowires was achieved by placing the substrate in an aqueous solution containing 0.025 M of zinc nitrate (purum p.a., crystallized, ≥99.0%) and 0.025 M of hexamethylenetetramine (Sigma-Aldrich, ACS reagent, ≥99.0%) at 90° C. for 2 hours.

Silicon nanopillar surfaces (FIG. 4D) with diameters of d=200 nm, heights of h=10 µm, and center-to-center spacings of l=2 µm (solid fraction $\varphi=\pi d^2/4l^2$=0.0079 and roughness factor $r=1+\pi dh/l^2$=3.47) were fabricated using projection lithography and deep reactive ion etching.

Functionalization.

TFTS (trichloro(1H,1H,2H,2H-perfluorooctyl)silane, Sigma) was deposited from the vapor phase. Prior to silane deposition, each tube was oxygen plasma cleaned for 2 hours to remove organic contaminants on the surface. Once clean, the tube samples were immediately placed in a vacuum desiccator (06514-10, Cole Parmer) with a small amount of liquid silane. The desiccator was evacuated by a roughing pump for 2 minutes to a minimum pressure of $\approx$2 kPa. A valve was then closed to isolate the pump from the desiccator and the sample was held in vacuum ($\approx$2 kPa) for another 7 minutes. The silanated tubes were then rinsed in ethanol and DI water, and dried in a clean nitrogen stream.

Thiol functionalization was achieved by first sputtering a $\approx$30 nm-thick coating of Au onto the CuO nanostructures. The samples were then solvent rinsed, dried, and plasma cleaned before immersion into a 1 mM solution of 1H,1H,2H,2H-perfluorodecanethiol (Sigma-Aldrich) in ethanol for 1 hour. Goniometric measurements (MCA-3, Kyowa Interface Science) of $\approx$100 nL droplets on a smooth thiolated surface showed advancing and receding contact angles of $\theta_a$=121.1°±2.2° and $\theta_r$=106.3°±2.4°, respectively.

Surface Characterization.

Advancing and receding contact angles for all samples were measured and analyzed using a micro-goniometer (MCA-3, Kyowa Interface Science Co., Japan). Field emission electron microscopy was performed on a Zeiss Ultra Plus FESEM (Carl Zeiss GMBH) at an imaging voltage of 3 kV.

S1. Condensation Chamber Setup

The custom environmental chamber used for this work (Kurt J. Lesker Company) consists of a stainless steel frame with a door (sealed with a rubber gasket), two viewing windows, and apertures for various components. Resistive heater lines were wrapped around the exterior of the chamber walls to prevent condensation at the inside walls and then insulated on the exterior walls. The output power of the resistive heater lines was controlled by a voltage regulator (Variac). Two insulated stainless steel water flow lines (Swagelok) were fed into the chamber via a KF flange port (Kurt J. Lesker Company) to supply cooling water to the chamber from a large capacity chiller (System III, Neslab).

A secondary stainless steel tube line was fed into the chamber via a KF adapter port that served as the flow line for the incoming water vapor supplied from a heated steel water reservoir. The vapor line was wrapped with a rope heater (60 W, Omega) and controlled by a power supply (Agilent). The vapor reservoir was wrapped with another independently-controlled rope heater (120 W, Omega) and insulated to limit heat losses to the environment. The access tubes were welded to the vapor reservoir, each with independently-controlled valves. The first valve (Diaphragm Type, Swagelok), connecting the bottom of the reservoir to the ambient, was used to fill the reservoir with water. The second valve (BK-60, Swagelok), connecting the top of the reservoir to the inside of the chamber, provided a path for vapor inflow. K-type thermocouples were located along the length of the water vapor reservoir to monitor temperature.

Figure 5A:
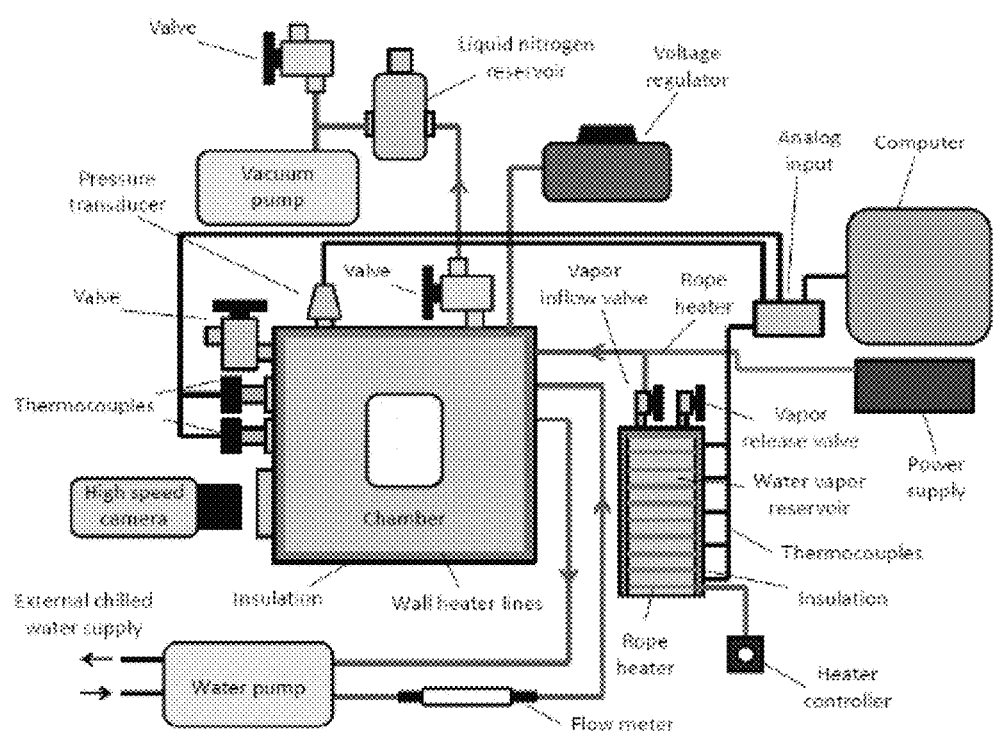
FIG. 5A is a schematic diagram of the experimental setup.
Figure 5B:
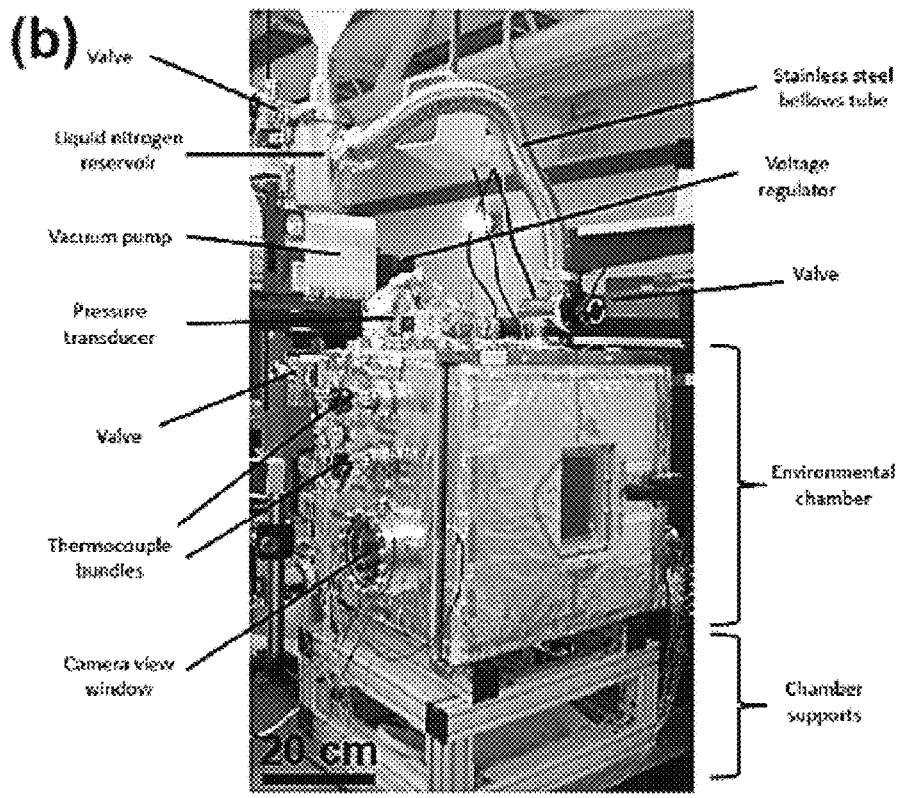
FIG. 5B is a photograph of the experimental setup shown from the front.
Figure 5C:
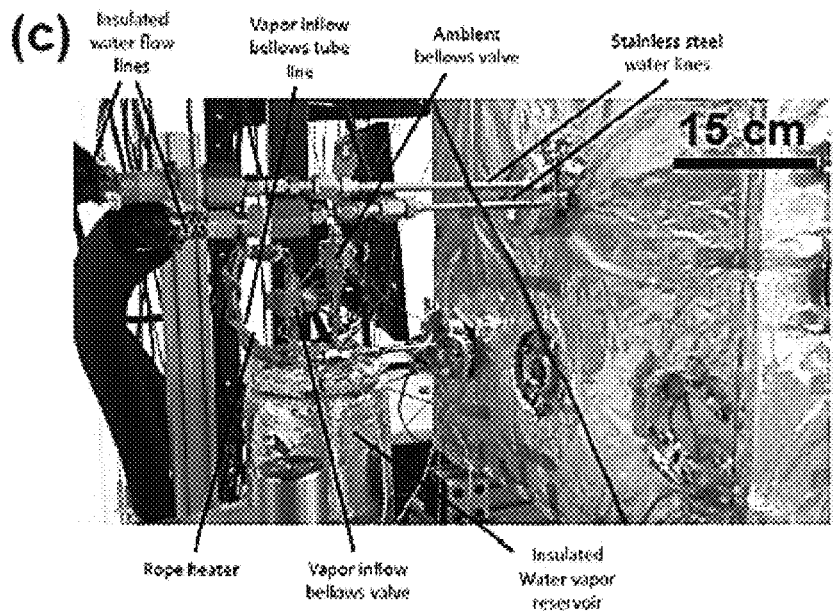
FIG. 5C is a photograph of the experimental setup from the rear of the chamber showing the cooling water inlet and outlet and water vapor reservoir.

A bellows valve (Kurt J. Lesker Company) was attached to the chamber to serve as a leak port between the ambient and inside of the chamber. In order to monitor temperatures within the chamber, K-type thermocouple bundles were connected through the chamber apertures via a thermocouple feed through (Kurt J. Lesker Company). To provide electrical connections inside the chamber for LED lighting and electric field generation, insulated copper electrical wires were connected through the chamber apertures via an electrical feed through (Kurt J. Lesker Company). A pressure transducer (925 Micro Pirani, MKS) was attached to monitor pressure within the chamber. The thermocouple bundles and the pressure transducer were both electrically connected to an analog input source (RAQ DAQ, National Instruments), which was interfaced to a computer for data recording. A second bellows valve (Kurt J. Lesker Company) was integrated onto the chamber for the vacuum pump, which brought down the chamber to vacuum conditions prior to vapor filling. A liquid nitrogen cold trap was incorporated along the line from the chamber to the vacuum which served to remove any moisture from the pump-down process and ultimately assist in yielding higher quality vacuum conditions. A tertiary bellows valve (Kurt J. Lesker Company) was integrated on a T fitting between the vacuum pump and liquid nitrogen reservoir to connect the vacuum line to the ambient to release the vacuum line to ambient conditions once pump down was achieved. In order to visually record data, a high speed camera (Phantom v7.1, Vision Research) was placed in line with the 5" viewing windows on the chamber. In addition, a digital SLR camera (Cannon) was interchangeable with the high speed camera to obtain color images. The schematic of the exterior of the environmental setup is depicted in FIG. 5A. Images of the front and rear of the experimental setup are shown in FIGS. 5B and 5C, respectively.

Figure 6A:
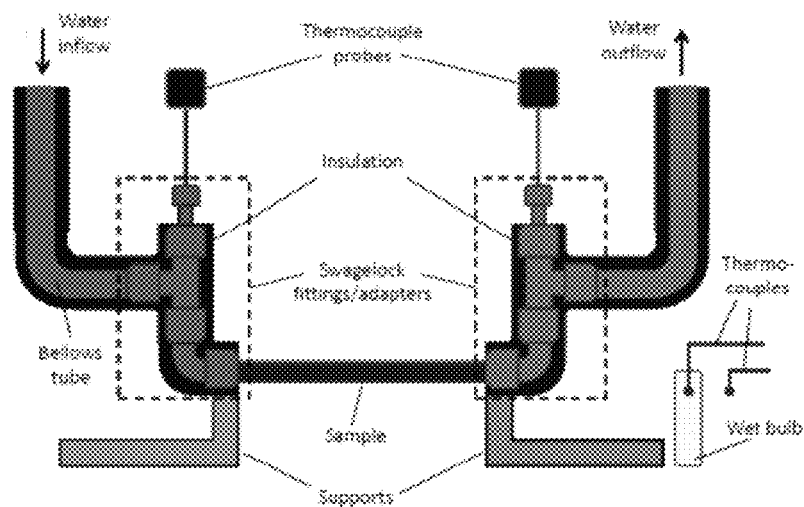
FIG. 6A is a schematic of experimental setup inside the chamber.
Figure 6B:
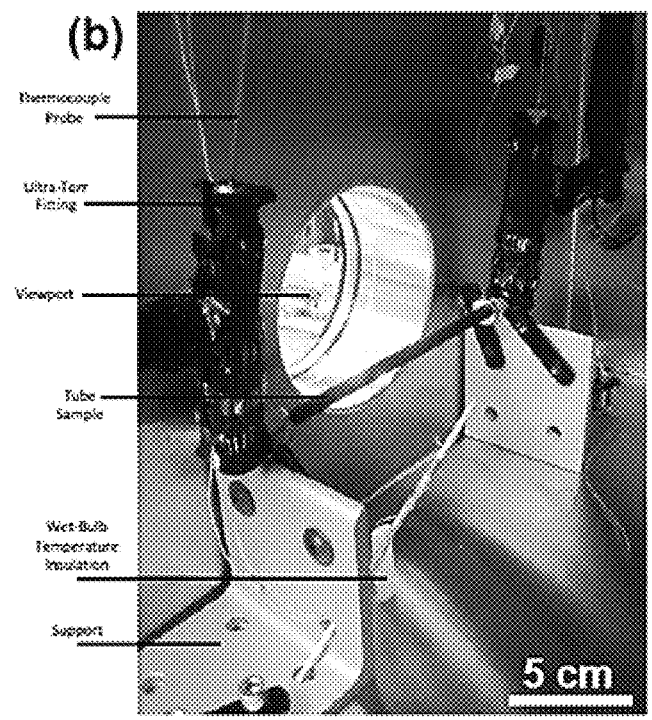
FIG. 6B is a photograph of the experimental setup inside the chamber showing a CuO nanostructured tube in place for testing.

The setup used to run experiments inside the chamber is shown in FIG. 6. Stainless steel bellows tube lines (¼", Swagelok) were connected to the external water flow lines (FIG. 5C). T-connection adapters (Swagelok) with bore through Ultra-Torr fittings (Swagelok) were used to adapt K-type thermocouple probes (Omega) at the water inlet and outlet.

The CuO nanostructure test sample consisted of a 6.35 mm diameter tube, which was connected via a Swagelok compression fitting onto the T-connection. Chilled water flows through the inlet bellows tube, along the inside of the tube sample and through the outlet. Two supports were used to hold the sample and the entire configuration in place. Two separate pieces of insulation were embedded with K-type thermocouple leads and used for wet bulb temperature measurement during experimental runs. A third thermocouple was placed beside the sample to measure the reference temperature inside the chamber.

S2. Condensation Procedure

For each experimental run, a set of strict procedures were followed to ensure consistency throughout the experiments. The first step of the process was to turn on the voltage regulator to heat up the environmental chamber walls, which prevented condensation on the chamber walls. Simultaneously, the water vapor reservoir was filled with approximately 3.5 liters of DI water (99% full) using a syringe through the vapor release valve. After opening the vapor inflow valve and closing the vapor release valve, the rope heater around the water vapor reservoir was turned on with the heater controller set to maximum output (120 W). Then the rope heater connected to the vapor inflow valve was turned on. The temperature of the water reservoir was monitored with the installed thermocouples; the temperature at the top of the reservoir was higher than that of the middle/bottom of the reservoir due to the water thermal-mass present at the middle/bottom section. Hence, the regions of the water reservoir of higher thermal capacity were brought to a sufficiently high temperature for boiling. During the boiling process, aluminum foil was placed on the bottom surface of the inner chamber to collect any of the water leaving the vapor inflow line. Once boiling was achieved and all thermocouples on the reservoir were >95° C. for at least 10 minutes, the vapor inflow valve was closed. The excess water that spilled inside the chamber during de-gassing of the reservoir was removed.

To install the samples onto the rig (FIG. 6B), the Swagelok female adapters at the ends of the tube samples were connected to the 90 degree male elbow connectors on the rig. Before installing the entire sample setup in the chamber, all adapters/connectors were tightened to ensure that there were no leaks that could affect vacuum performance. The setup was then placed on top of the steel supports and the bellows tubes (for the water inflow/outflow) were connected to the water lines. Then the insulating wet bulb wick was placed near the sample and in contact with the bottom surface of the chamber.

The next step was to begin the vacuum pump-down procedure. Initially, the liquid nitrogen cold trap was filled to about half capacity. The ambient exposed valves connecting the chamber and the vacuum pump were both closed and the valve connected to the liquid nitrogen cold trap was opened. The vacuum pump was then turned on, initiating the pump-down process. The pressure inside the chamber was monitored during the pump-down process. This process took approximately one hour in order to achieve the target vacuum conditions (0.5 Pa<P<1 Pa). The experimental operating pressure of non-condensable was set to be a maximum of 0.25% of the operating pressure. Non-condensable gas content of above 0.5% (pressure) was shown to significantly degrade performance during dropwise condensation. See, Ma, X. H.; Zhou, X. D.; Lan, Z.; Li, Y. M.; Zhang, Y. Condensation Heat Transfer Enhancement in the Presence of Non-Condensable Gas Using the Interfacial Effect of Dropwise Condensation. *Int. J. Heat Mass Tran.* 2008, 51, 1728-1737, and Rose, J. W. Dropwise Condensation Theory and Experiment: A Review. *P. I. Mech. Eng. a-J. Pow.* 2002, 216, 115-128, each of which is incorporated by reference in its entirety. Extreme care was taken to properly de-gas the vacuum chamber and water vapor reservoir prior to experimental testing. In addition, the chamber leak rate was characterized prior to each run in order to estimate the maximum time available for acquiring high fidelity data with non-condensable content of less than 0.25%.

The setup of the water flow-loop is described as follows. The Neslab water pump reservoir was filled and turned on to a flow rate of 0.5±0.025 L/min (for heat transfer measurement experiments). The flow rate was monitored with the flow meter integrated in the inflow water line (0-5 L/min L-Series liquid flow meter, Alicat). In order to bring the chilled water into the flow loop and to the tube sample, the external chilled water lines were opened. Prior to beginning experiments, the high-speed camera was turned on for visual recording of the sample during condensation. Afterwards, the rope heater around the water reservoir was turned off and the vapor inflow valve was slowly turned open until the operating pressure was reached. Steady state conditions were typically reached after 2 minutes of full operation.

S3. Electric Field Experiments

Wire Electrode—Identifying Charge Polarity

Figure 7:
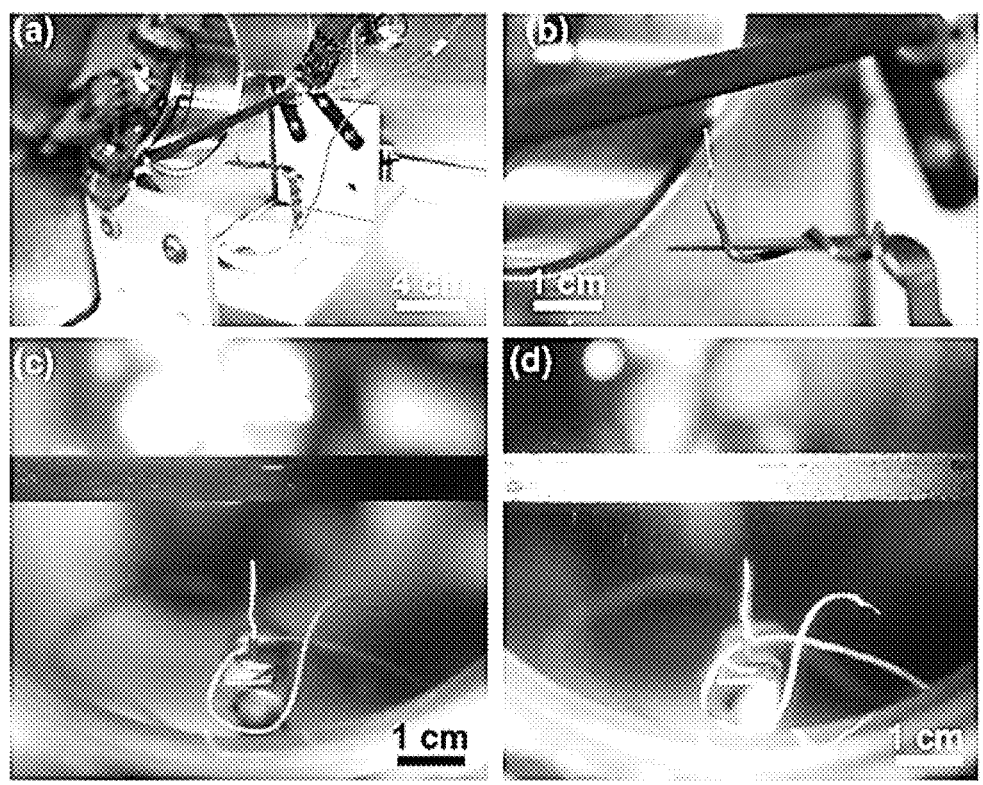
FIGS. 7A-7D are photographs depicting the electrode experimental setup inside the chamber.

To study the effect of droplet charging, the experimental setup was modified to include an electrode placed beneath the CuO nanostructured tube (FIG. 7). The electrode (red insulated wire) was connected to the insulated copper electrical feed through and brought in close proximity (<1 cm) to the tube via an insulated copper holder made from a strip of copper sheet. To electrically insulate the holder, a piece of insulation was placed beneath it (FIG. 7A). The electrode was energized by an external 600 V DC power supply (Agilent Technologies, N5752A). The negative terminal of the power supply was grounded to the tube. The terminals could be reversed externally in order to study the polarity of the droplet charge by reversing the direction of the established electric field between the electrode and grounded tube. FIGS. 7C and 7D show typical views from the side viewport of the tube-electrode setup before and after condensation initiates ($\Delta V=0$ V), respectively. To monitor the local temperature close to the electrode, a K-type thermocouple was placed in close proximity (FIGS. 7C and 7D).

Parallel Plate Electrodes—Identifying Charge Magnitude

To study the magnitude of the charge imparted on the droplet (in addition to verifying the polarity), a Millikan (*Physical Review*, 1913) inspired parallel plate setup was used to establish a uniform electric field. The previously discussed wire electrode setup was advantageous in providing a simple measure of charge polarity; however, it was difficult to utilize for calculating the magnitude of the charge. The difficulty was related to potential charge accumulation on the hydrophobic coating (Buch, V., Milet, A., Vacha, R., Jungwirth, P. & Devlin, J. P. Water surface is acidic. *P Natl Acad Sci USA* 104, 7342-7347, (2007), which is incorporated by reference in its entirety, and Tian, *PNAS*, 2009), making it difficult to calculate an accurate electric field magnitude. In addition, the non-uniform electric field established between the tube and electrode added increased complexity to the charge calculation. Furthermore, the non-uniform electric field had the potential to create a dielectrophoretic force component on the jumping droplets (Clogston, J. D. & Patri, A. K. Zeta Potential Measurement. *Methods Mol Biol* 697, 63-70, (2011), which is incorporated by reference in its entirety.), creating additional difficulty for the determination of droplet charge.

Figure 8:
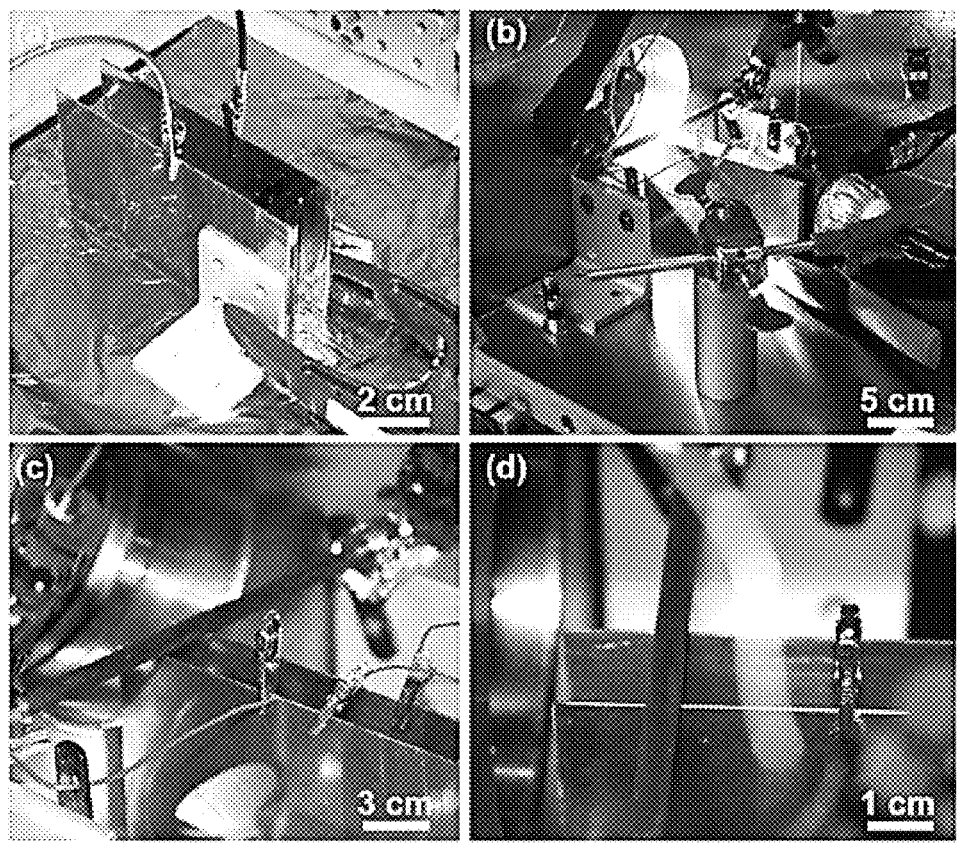
FIGS. 8A-8D are photographs depicting the parallel plate setup.

To accurately obtain the magnitude of the charge on the droplets, a uniform electric field was used. Two 10×20 cm polished copper plates (McMaster) were arranged in a parallel configuration (FIG. 8A) and placed beneath the tube sample (FIG. 8B). One plate was connected to ground (right plate when viewed from the front view port), while the other was energized by the external DC power supply (left plate when viewed from the front view port, FIG. 8C shows the parallel plate setup inside the chamber with electrical connections shown (red wire is common ground for the tube and plate), and FIG. 8D shows the parallel plate side view inside the chamber showing the CuO nanostructured tube 1 cm above the plates.). The ground plate was also connected to the tube (red wire, FIG. 8C) to ensure an accurate potential measurement. The bottom sides of the plates were masked with Teflon tape, providing electrical insulation from the chamber walls. The LED light (FIG. 8B) was placed behind the plates and shining between them towards the view port.

Once condensation initiated, droplets jumping from the surface were captured between the parallel plates, reaching terminal velocity in the process and allowing for the trajectory to be analyzed (see section S4). The high speed and SLR cameras were used to image the droplet motion between the plates. The focal plane was set to lie beneath the tube where droplet motion was frequent.

S4. Droplet Force Balance

Figure 9:
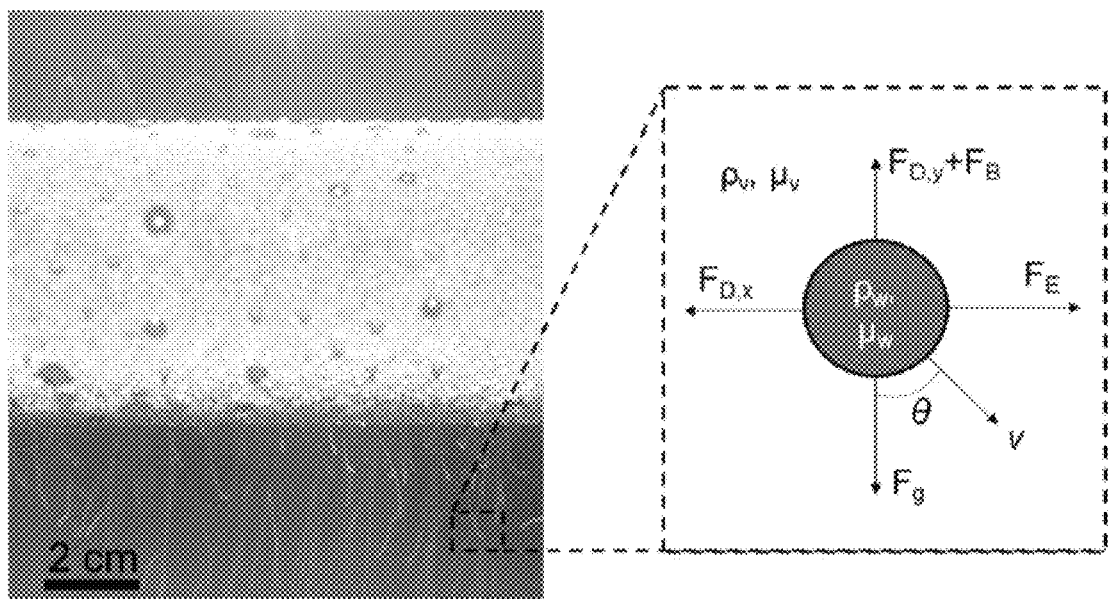
FIG. 9 is a photograph of the droplet jumping phenomenon on the CuO nanostructured tube sample coated with TFTS and the corresponding schematic showing the forces acting on a departed droplet.

To determine the droplet charge, the trajectory of jumping droplets captured in the uniform electric field (between the parallel plates) was analyzed and compared with a developed model of droplet trajectory. To model the droplet motion, a force balance was considered on charged droplets traveling downward in the uniform electric field (FIG. 9). The forces in the x-direction are the electric field force ($F_E=q\cdot E$), and the drag force ($F_{D,x}=F_D\cdot\sin\theta$), where q is the charge on a droplet, E is the electric field strength, $F_D$ is the drag force on the droplet, and $\theta$ is the deflection angle of the droplet measured from the vertical axis (FIG. 9). The forces in the y-direction are the drag force ($F_{D,y}=F_D\cdot\cos\theta$), the gravitational force ($F_g=\rho_w\cdot V\cdot g=m\cdot g$) and the buoyancy force ($F_B=\rho_v\cdot V\cdot g$). The sum of forces in the x and y directions yield the following equations of motion, respectively:

$$qE=F_D \sin\theta. \quad (S1)$$

$$mg=F_D \cos\theta. \quad (S2)$$

Note that, due to the large density difference between the liquid ($\rho_w=998.025$ kg/m$^3$) and vapor phases ($\rho_v=0.0269$ kg/m$^3$), the buoyancy force is negligible, i.e., $\rho_v \ll \rho_w$. Dividing equations S1 and S2, a trajectory equation that relates the measurable quantities to the droplet charge is obtained:

$$\frac{q}{m} = \frac{g}{E}\tan\theta. \quad (S3)$$

The deflection angle $\theta$ can be determined from the high speed camera video. Due to the low magnification of the camera setup, determining droplet mass (via measuring the droplet radius) was difficult. In order to determine the droplet mass, equation S2 was solved independently. To determine the drag force on the droplet in the y-direction, the Stokes flow approximation was used. This was deemed appropriate due to the low Reynolds numbers of the droplet motion, characterized by $Re=[\varrho_v\cdot v_y(2\cdot R)]/\mu_v<0.02$ for all droplets considered in this experiment, where $v_y$ is the velocity component in the y-direction, and $\mu_v$ is the vapor viscosity ($\mu_v=9.86\times10^{-6}$ Pa·s). Using the Stokes approximation yields a radial dependent Stokes drag (Kundu, P. K., Cohen, I. M. & Dowling, D. R. *Fluid mechanics*. 5th edn, (Academic Press, 2012), which is incorporated by reference in its entirety.), $F_{D,y}=6\cdot\pi\cdot\mu_v\cdot v_y\cdot R$ which can be equated to the gravitational force and solved for R as follows:

$$6\pi\mu_v v_y R = \frac{4}{3}\pi\rho_w R^3 gC, \quad (S4)$$

$$R = \sqrt{\frac{9\mu_v v_y}{2g\rho_w C}}, \quad (S5)$$

$$m = \frac{4}{3}\pi R^3 \rho_w = \pi\sqrt{\frac{162\mu_v^3 v_y^3}{g^3 \rho_w C^3}}, \quad (S6)$$

where C is the Cunningham slip correction for small droplets when air no longer behaves like a continuous fluid and accordingly, to account for the apparent decrease in fluid viscosity that results (Cunningham, E. On the velocity of steady fall of spherical particles through fluid medium. *P R Soc Lond a-Conta* 83, 357-365, (1910), which is incorporated by reference in its entirety.). This correction factor is based on the relative dimensions of size of $\lambda$, the mean free path of the gas molecules ($\lambda\approx4.1$ µm at $P_{sat}=2700$ Pa), and the particle diameter, 2R. The ratio of these is the Knudsen number, $Kn=\lambda/2R$. The correction factor is equal to:

$$C = 1 + 2Kn\left[1.257 + 0.4\exp\left(-\frac{0.55}{Kn}\right)\right]. \quad (S7)$$

The above analysis is only valid for droplets which have reached terminal velocity. Droplets undergoing acceleration will show a variable deflection angle θ. To check the validity of this assumption, all droplets considered were analyzed for many frames to ensure terminal condition. Furthermore, the long exposure SLR images (FIG. 3C) showed trajectories that were straight lines, indicating terminal velocity has been reached.

Once the mass and deflection angles were calculated from analyzing the high speed video, Equation S3 was used to determine the charge on the droplet. It is important to note the error associated with Stokes approximation in conjunction with the Cunningham slip factor was assumed to be a conservative estimate of 8% (Lamb, H. *Hydrodynamics*. 5th edn, (University Press, 1930), which is incorporated by reference in its entirety.)

S5. Smooth and Rough Surface Characterization

Figure 10:
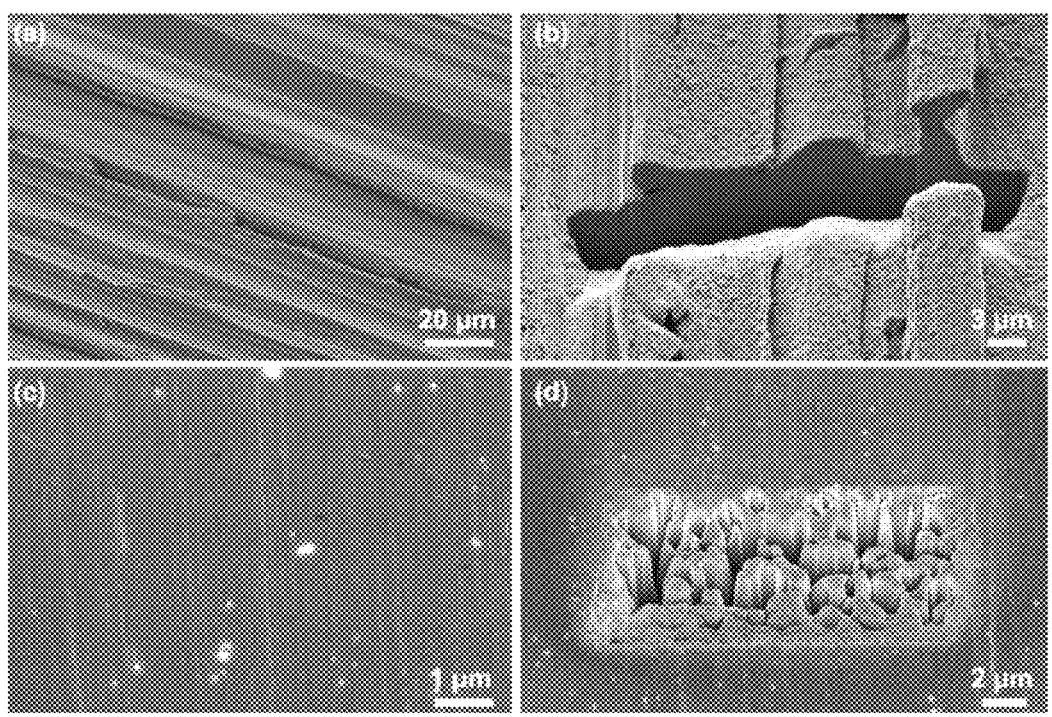
FIGS. 10A-10D are photographs depicting the rough and smooth Cu sample before and after FIB milling.

To study the effects of macroscale roughness, CuO nanostructuring was performed on Cu samples with smooth polished surface finishes (Alloy 110 polished, McMaster-Carr) and a rough tool finish (Alloy 110 tool finish, McMaster-Carr). In order to characterize the surface roughness prior to nanostructuring, FESEM and focused ion beam (FIB) milling was used (FIG. 10). Focused ion beam milling (NVision 40 Dual Beam Focused Ion Beam, Carl Zeiss GMBH) was performed with normal incidence of the ion beam (sample tilt of 54°), ion beam energy of 30 keV, and ion current of 300 pA. The structure cross-sections were obtained by milling 8 μm deep×20 μm wide trenches. Due to the good milling response of copper, surface polishing was not required. All samples were imaged at a 36° tilt using the in lens detector with electron beam energies of 7 keV. Surface characterization showed a characteristic roughness of ~10 nm and ~5 μm for the smooth and rough surfaces, respectively.

S6. Time Scale Analysis

Water deposition on any surface with a known zeta potential, ζ, will initiate the buildup of an electrical double layer on the surface (Clogston, J. D. & Patri, A. K. Zeta Potential Measurement. *Methods Mol Biol* 697, 63-70, (2011), which is incorporated by reference in its entirety.). If a droplet is deposited on a hydrophobic surface, the hydrophobic coating will begin to adsorb charge preferentially depending on the zeta potential of the coating. A review of previous literature indicates that most hydrophobic coatings have a negative zeta potential (McCarty, *Angew Chem Int Edit*, 2008), i.e., that they will preferentially accumulate OH⁻ anions from the aqueous phase in the immobile Stern layer (Buch, *PNAS*, 2007 and Tian, *PNAS*, 2009). If the droplet is removed slowly from the surface however, the slow buildup of solvated hydronium (H⁺) cations inside the bulk of the droplet will increase the driving force for anion separation from the solid/liquid interface. This effect gives rise to charge neutrality inside the liquid bulk and little if any measurable charge left on the removed droplet. However, if the droplet is removed quickly (as is the case is droplet coalescence and jumping), the time required for anion separation is insufficient, and the jumping droplet can leave the surface with a higher concentration of H⁺ cations, while leaving behind a pinned liquid film with excess OH⁻ anions.

Comparing the critical time scales of the coalescence process with the time scales required for the mobile OH⁻ anion to transport to the bulk liquid droplet (as in the case of slow droplet removal) provides insights into which process dominates the droplet jumping physics. The surface tension driven coalescence of two droplets (R≥2 μm) is governed by an inertial/capillary scaling. The inertial and capillary energies scale as the following (see Eggers, *J Fluid Mech*, 1999, Paulsen, *Phys Rev Lett*, 2011, and Wu, *Phys Fluids*, 2004):

$$\rho_v R^3 U^2 \sim R^2 \sigma, \tag{S8}$$

where σ is the droplet surface energy, and U is the characteristic droplet velocity governed by the liquid bridging process during coalescence (Wu, *Phys Fluids*, 2004), which can be represented by U~R/τ, where τ is the critical time scale for droplet bridge formation and coalescence. Substituting the scaling for U and isolating for τ, the coalescence time scale is obtained:

$$\tau_c \sim \sqrt{\frac{\rho_l R^3}{\sigma}}. \tag{S9}$$

Figure 11:
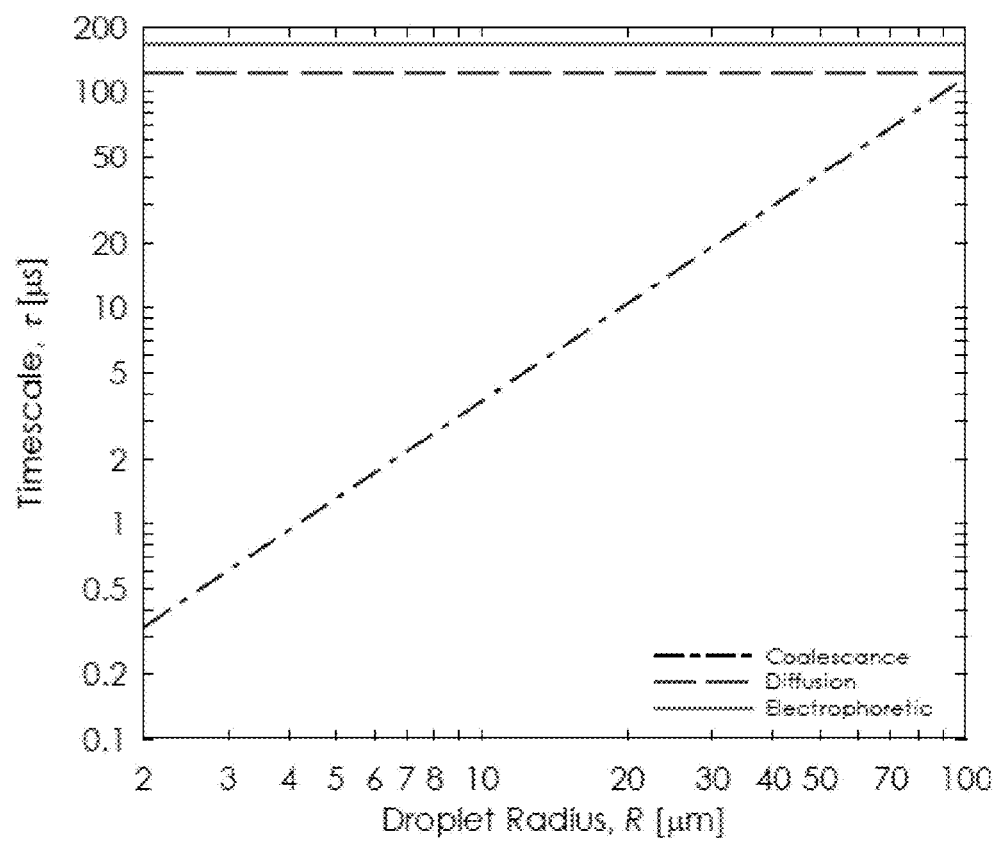
FIG. 11 is a graph depicting the time scale τ as a function of the coalescing droplet radius, R, for the coalescence (black dotted line), diffusion (blue dashed line) and electrophoretic (red solid line) processes.
Figure 12:
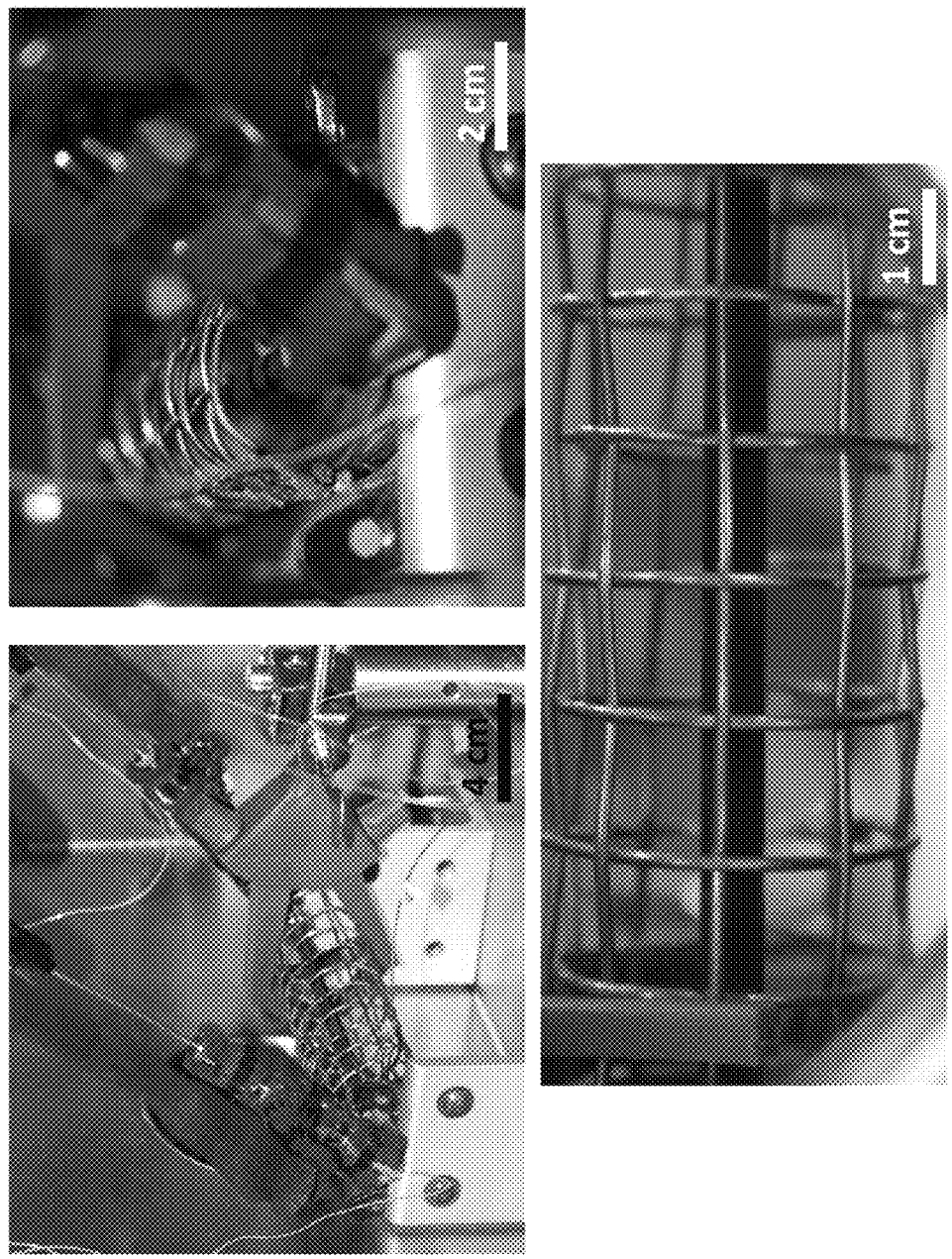
FIG. 12 is a series of photographs of the electric filed enhanced experimental demonstration showing the electrode tube (copper wire mesh) outside of the nanostructures CuO tube (black tube). The red clamp shown in a holder of the electrode tube.

In order to compare the time scale of the free anion transport from the Stern layer on the hydrophobic surface to the droplet bulk, the droplet surface separation process needs to be understood. When droplets coalesce and jump from the surface, they tend to leave behind a pinned liquid region within the micro/nanoscale structures. This pinned liquid region has a high adhesion and the coalescence event has insufficient energy to remove the pinned liquid with departing coalescing droplets (Enright, R., Dou, N., Miljkovic, N., Nam, Y. & Wang, E. N. Condensation on Superhydrophobic Copper Oxide Nanostructures. *3rd Micro/Nanoscale Heat & Mass Transfer International Conference*, (2012) and Enright, R., Miljkovic, N., Al-Obeidi, A., Thompson, C. V. & Wang, E. N. Superhydrophobic Condensation: The Role of Length Scale and Energy Barriers. *Langmuir* 40, 14424-14432, (2012), each of which is incorporated by reference in its entirety.). If an anion becomes free of the Stern layer due to an electric field buildup, it would have to transport through the pinned liquid region prior to entering the jumping droplet (FIG. 10). FIG. 10 shows the images of the rough Cu sample before (FIG. 10A) and after (FIG. 10B) FIB milling and the images of the smooth Cu sample before (FIG. 10C) and after (FIG. 10D) FIB milling. Milling of the smooth sample resulted in non-uniformity due to the presence of grain boundaries. The characteristic transport length is therefore characterized by the structure height, h. The anion has two possible transport mechanisms, diffusion of the desorbed ion through the pinned liquid region residing in the structure (Wraight, C. A. Chance and design—Proton transfer in water, channels and bioenergetic proteins. *Bba-Bioenergetics* 1757, 886-912, (2006), which is incorporated by reference in its entirety.), and electrophoresis (Plenert, M. L. & Shear, J. B. Microsecond electrophoresis. *Proc Natl Acad Sci USA* 100, 3853-3857, (2003), which is incorporated by reference in its entirety.) of the desorbed ion due to the formation of the counter electric field generated within the droplet. The diffusion (Carey, V. P. *Liquid-Vapor Phase-Change Phenomena: An Introduction to the Thermophysics of Vaporization and Condensation Processes in Heat Transfer Equipment*. 2nd edn, (Taylor and Francis, 2008), which is incorporated by reference in its entirety.), and electrophoretic time scales (Plenert, M. L. & Shear, J. B. Microsecond electrophoresis. *Proc Natl Acad Sci USA* 100, 3853-3857, (2003), which is incorporated by reference in its entirety.) for transport across the gap can be estimated as:

$$\tau_D \sim \left(\frac{h}{2\sqrt{D_{H^+}}}\right)^2, \tag{S10}$$

$$\tau_{EP} \sim \frac{h}{\mu_{e,H+}\overline{E}}, \tag{S11}$$

where $\tau_D$ and $\tau_{EP}$ are the calculated diffusion and electrophoretic time scales, respectively, $D_{H+}$ is the diffusivity of the H$^+$ ion ($D_{H+}$=8.1×10$^{-9}$ m$^2$/s) (Wright, *Bba-Bioenergetics*, 2006), $\mu_{e,H+}$ is the combined electrophoretic and electroosmotic mobility of the H$^+$ ion ($\mu_{e,H+}$=3.2×10$^{-7}$ m$^2$/V·s) (Duso, A. B. & Chen, D. D. Y. Proton and hydroxide ion mobility in capillary electrophoresis. *Anal Chem* 74, 2938-2942, (2002), which is incorporated by reference in its entirety.), and $\overline{E}$ is the applied electric field. H$^+$ was chosen as the ion for analysis due to its larger diffusivity and mobility when compared to OH$^-$, allowing for a conservative estimate of the critical time scales. As mentioned previously, if the time scale of droplet coalescence is faster than the diffusion and electrophoretic processes, insufficient time is available for OH$^-$ desorption and subsequent transport to the droplet bulk before it jumps. FIG. 11 shows the calculated characteristic time scales, indicating that $\tau_c/\tau_d$<<1 and $\tau_c/\tau_e$<<1 for the entire range of measured droplet charge (2<R<40 μm).

S7. Zeta Potential Calculation

To gain increased understanding of the magnitude of the droplet charging, and to correlate it better to the zeta potential of the tested hydrophobic coatings, the effective zeta potential of the surface was calculated using the measured charge of the droplets. The force, $F_E$, on a charged water droplet (with a finite zeta potential) due to an applied electric field can be calculated by (Gu, J. G. & Li, D. Q. The zeta-potential of silicone oil droplets dispersed in aqueous solutions. *J Colloid Interf Sci* 206, 346-349, (1998), which is incorporated by reference in its entirety.):

$$F_E = 4\pi R \varepsilon_r \varepsilon_0 \zeta \overline{E} f_1(\kappa R), \tag{S12}$$

where $\varepsilon_r$ and $\varepsilon_0$ are the dimensionless dielectric constant of the aqueous solution ($\varepsilon_r$≈80 for water) and the dielectric permittivity of free space ($\varepsilon_0$=8.854×10$^{-12}$ F/m), $\zeta$ is the droplet zeta potential, $\overline{E}$ is the electrostatic field strength, and $f_1(\kappa \cdot R)$ is the well-known Henry function (Sawatzky, R. P. & Babchin, A. J. Hydrodynamics of Electrophoretic Motion in an Alternating Electric-Field. *J Fluid Mech* 246, 321-334, (1993), which is incorporated by reference in its entirety.), x is the Debye-Huckel constant, which mainly depends on the ionic properties of the aqueous phase, and 1/x characterizes the electric double layer (EDL) thickness. The Henry function was calculated based on the EDL thickness, and was determined to be $f_1(\kappa \cdot R, R/\delta)$=1.5. By relating Equation S11 to the force on a charged droplet, the zeta potential can be expressed as:

$$\zeta = \frac{q}{6\pi R \varepsilon_r \varepsilon_0}, \tag{S13}$$

Due to charge neutrality, the estimated zeta potential of the droplet can be related to the zeta potential of the surface by $\zeta_{droplet}$=−$\zeta_{surface}$. Substituting in characteristic values (q=+9 and +6 fC at R=7 μm for thiol and TFTS, respectively) determined from the experiments in order to estimate the zeta potential, $\zeta_{thiol}$≈−84 mV and $\zeta_{TFTS}$≈−56 mV and for the thiol and TFTS coated surfaces were obtained, respectively.

S8. Bulk Vapor Flow

Figure 19:
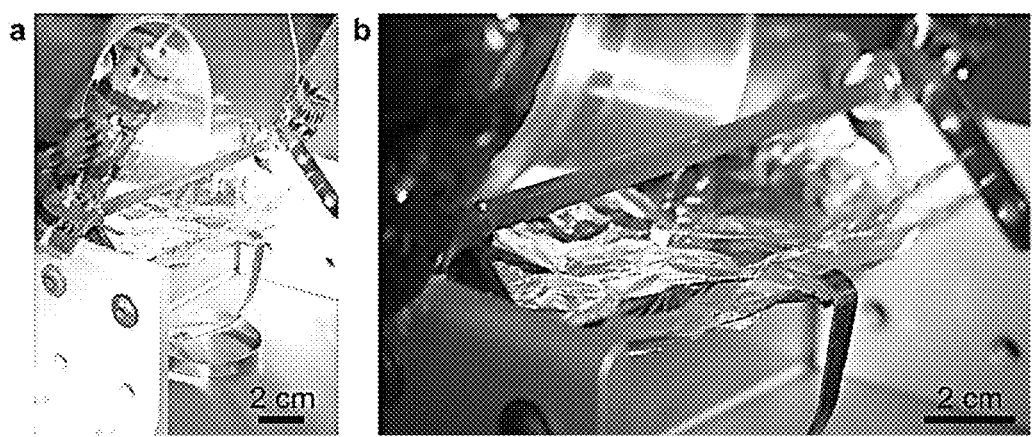
FIGS. 19A-19B are photographs depicting an experimental setup to divert any bulk vapor flow upwards past the tube and limit interference with droplets traveling downwards.

Bulk vapor flow from buoyancy effects in the surrounding vapor can lead to vapor return. To prevent vapor from condensing on the chamber walls during testing, the temperature of the chamber during condensation testing was superheated ($\Delta T=T_{wall}-T_{sat}$≈4° C.). The higher temperature of the bottom chamber wall could create a buoyant vapor flow upwards past the tube which would entrain departing droplets. To test the bulk vapor flow hypothesis, the experimental setup was modified to include a blockage (consisting of an aluminum foil sheet) beneath the tube (condensing surface) such that any bulk vapor flow would be diverted past the sides of the tube and not interfere with droplet jumping (FIG. 19). In this way, any bulk vapor flow upwards past the tube is diverted and interference with droplets traveling downwards is limited. Test results after installation of the blockage showed no change in jumping droplet behavior. Return of droplets from the bottom surface was as frequent as prior to installation of the blockage. The results indicated that droplet entrainment in a bulk vapor flow was not the mechanism of droplet return against gravity.

S9. Jumping Droplet Initial Velocity

Figure 20:
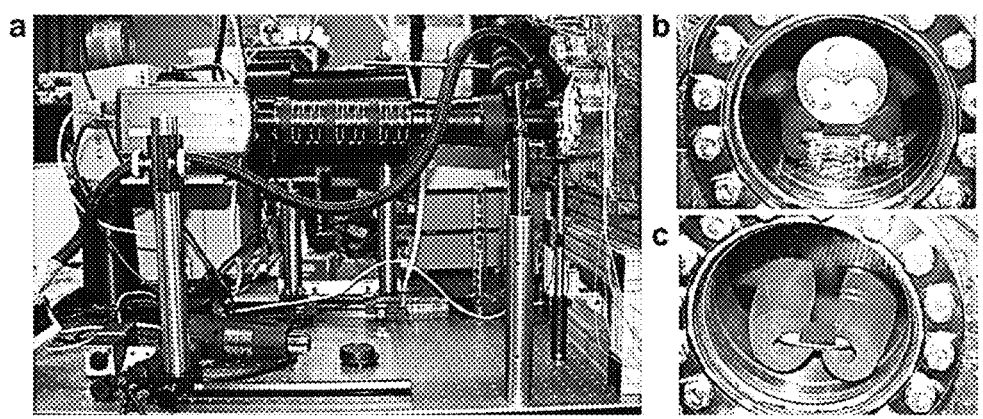
FIGS. 20A-20C are photographs depicting High speed and high magnification imaging setup for jumping droplets.

The droplet ejection process was captured under saturated conditions inside the environmental chamber (Section S1) using a single-camera setup. See, Boreyko, J. B.; Chen, C.-H. Self-Propelled Dropwise Condensate on Superhydrophobic Surfaces. *Phys. Rev. Lett.* 2009, 103, 184501, which is incorporated by reference in its entirety. The out-of-plane trajectory of the ejected droplets was captured using a high-speed camera (Phantom v7.1, Vision Research) at frame rates of 7200, 10000 and 20000 fps corresponding to shutter speeds of 139 μs, 100 μs and 50 μs, respectively. The camera was mounted outside the environmental chamber and fitted with an extended macro lens assembly (FIG. 20). FIG. 20 shows high speed and high magnification imaging setup for jumping droplets. The experimental setup (FIG. 20A) shows the high speed camera placed adjacent to the chamber and retrofitted with extension tubes for higher magnification imaging and the sample holder inside the chamber (FIG. 20B) with LED light placed behind and (FIG. 20C) without LED light. The lens assembly consisted of a fully extended 5× optical zoom macro lens (MP-E 65 mm, Canon), connected in series with 3 separate 68 mm extension tubes (Auto Extension Tube Set DG, Kenko). The DG extension tubes enable the lens to focus closer than its normal set minimum focal distance, which has the effect of magnifying the image (making it appear larger in the viewfinder). The DG extension tubes have no optics. They were mounted in between the camera body and lens to create more distance between the lens and film plane. By moving the lens further away from the film or CCD sensor in the camera, the lens was allowed to focus much closer than normal. Illumination was supplied by light emitting diodes installed inside the chamber and providing back lighting to the sample.

Figure 21:
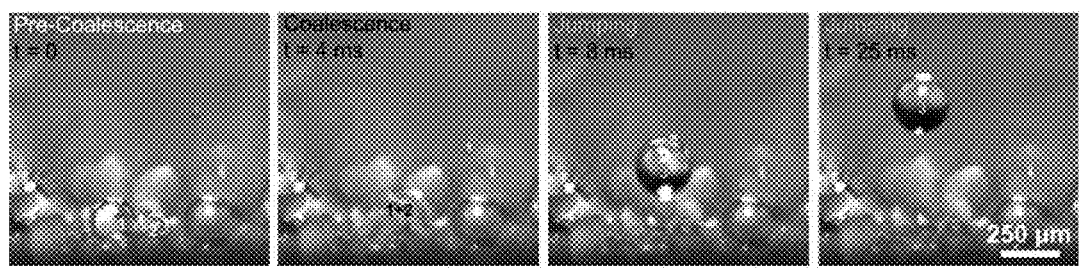
FIG. 21 is time-lapse images of High speed droplet jumping.

The experiment was initiated by first evacuating the environmental chamber to medium-vacuum levels (=0.5±0.025 Pa, see section S2). The sample was mounted to a flattened copper tube connected to an external cooling loop and was maintained at a temperature of Tw=26° C. (pw=3.33 kPa) (FIGS. 20B and 20C). The water vapor supply was vigorously boiled before the experiments to remove non-condensable gases. Water vapor was introduced into the environmental chamber via a metering valve set to maintain the chamber pressure at pv=3.6±0.175 kPa. FIG. 21 shows a typical high speed time-lapse obtained during jumping-droplet condensation. Time-lapse images captured via high speed camera (FIG. 20) of water condensation on the nanostructured CuO surface. Droplet 1 and 2 initially grow independently until coalescing and then jumping from the surface (Pv=3600±175 Pa, Ts=26±0.2° C.).

Figure 22:
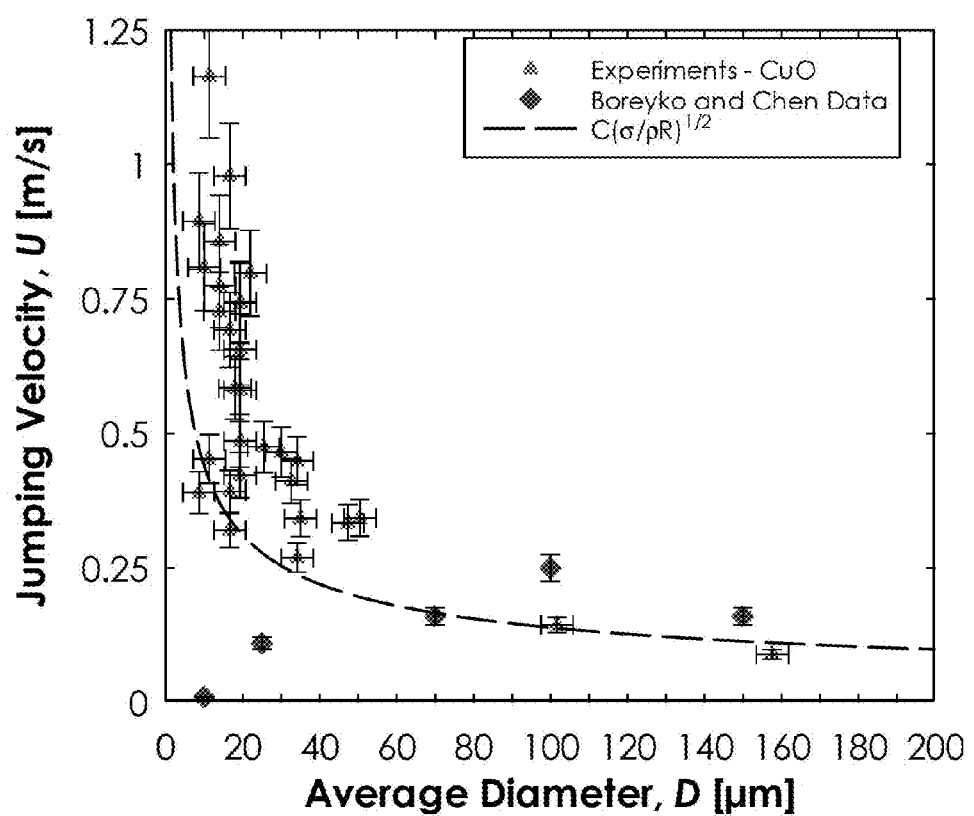
FIG. 22 is a graph depicting Droplet size dependence on jumping droplet initial velocity.

The initial droplet ejection velocity (U) as a function of droplet diameter (2R) is shown in FIG. 22. The experimental results show good agreement with the inertial-capillary scaling by balancing the surface energy and kinetic energy of the ejected droplet to obtain a characteristic ejection velocity of $$U \sim \sqrt{(\gamma/\rho R)}. \tag{S14}$$

This characteristic velocity corresponds to a value of unity for the Weber number, We=$(\rho\_w\ U^2\ R)/\gamma$=1, where $\gamma$ is the water surface tension ($\approx$72 mN/m). In order to account for the incomplete conversion of excess surface energy to kinetic energy not captured by the scaling, a proportionality constant C was introduced, on the right hand side of equation (S14). For the experiments on CuO at low vapor pressure (Pv<4000 Pa), equation (S14) best fits the experimental data with C$\approx$0.23.

S10. Flooding Mechanisms

Figure 23:
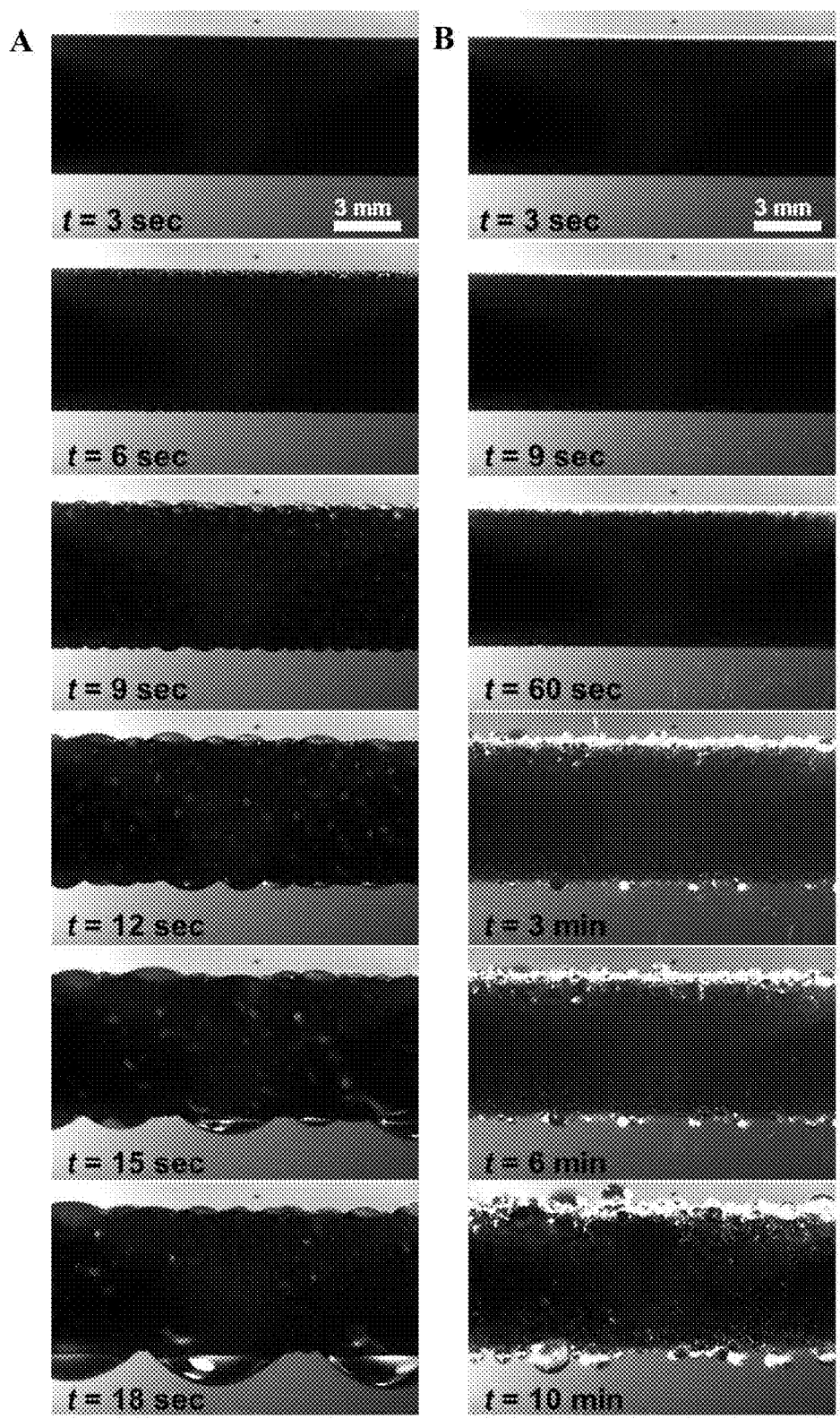
FIG. 23A is time-lapse images of nucleation-density-mediated flooding.
FIG. 23B is time-lapse images of progressive flooding.

Jumping-droplet condensation has two distinct flooding mechanisms: nucleation-density-mediated flooding, and progressive flooding (FIG. 23). FIG. 23 shows time-lapse images of nucleation-density-mediated flooding (FIG. 23A, $P_v$=2700±75 Pa, S$\approx$1.5) and progressive flooding (FIG. 23B, $P_v$=2700±75 Pa, S$\approx$1.08) on a superhydrophobic CuO surface. Jumping-droplet condensation with progressive flooding shows significant droplet return to the surface due to vapor flow entrainment. As time progressed (t→10 min) the average droplet size on the surface increased and limited heat transfer performance. Nucleation-density-mediated flooding occurred very quickly (t<18 s) and resulted in no droplet jumping due to the formation of highly pinned Wenzel droplets. See, Enright, R.; Miljkovic, N.; Al-Obeidi, A.; Thompson, C. V.; Wang, E. N. Superhydrophobic Condensation: The Role of Length Scale and Energy Barriers. *Langmuir* 2012, 40, 14424-14432, Enright, R.; Miljkovic, N.; Dou, N.; Nam, Y.; Wang, E. N. Condensation on Superhydrophobic Copper Oxide Nanostructures. *J. Heat Transf.* 2013, 135, 091304, and Miljkovic, N.; Enright, R.; Nam, Y.; Lopez, K.; Dou, N.; Sack, J.; Wang, E. N. Jumping-Droplet-Enhanced Condensation on Scalable Superhydrophobic Nanostructured Surfaces. *Nano Lett.* 2013, 13, 179-187, each of which is incorporated by reference in its entirety. Nucleation-density-mediated flooding can be explained in terms of the interplay between the characteristic structure length scale and droplet nucleation density. At low supersaturations (S<1.12, low nucleation density), droplets form with large spacings between each other relative to the spacing of the CuO nanostructures such that droplets could evolve into the energetically favorable partially wetting (PW) Cassie-like morphology. See, Miljkovic, N.; Enright, R.; Wang, E. N. Effect of Droplet Morphology on Growth Dynamics and Heat Transfer during Condensation on Superhydrophobic Nanostructured Surfaces. *ACS Nano* 2012, 6, 1776-1785, which is incorporated by reference in its entirety. For higher supersaturations (S>1.12), the droplet nucleation density increases to the point where droplet/droplet interactions occur on a similar length scale as the nanostructure spacing ($\approx$1 µm), and droplets, instead of forming in the energetically favorable PW morphology, merge to form pinned liquid films due to contact line depinning at their base. Further condensation on the "flooded" surface results in the formation of Wenzel droplets which demonstrate significant contact line pinning, large droplet shedding diameters, and irregular droplet shapes (FIG. 23A).

Progressive flooding occurs due to the return of vapor entrained jumping droplets back to the the condensing surface. As droplets return, some may coalesce and jump again, while others may remain pinned to the surface. In contrast to nucleation-density-mediated flooding, the pinned droplets remain in a PW wetting (Cassie like) morphology and have the potential to can merge again with neighboring droplets and jump from the surface. Over time however, the 'progressive' return and pinning on droplets results in a higher population of large droplets (FIG. 23B), and gradual degradation in heat transfer performance. Due to the relation between vapor velocity and condensation heat flux (supersaturation), lower supersaturations result in smaller degrees of progressive flooding on the condensing surface and slower degradation of performance over time.

It is important to note, the heat transfer values reported in Miljkovic et al. (Nano Letters, 2013) are still valid, but represent the peak limit to heat transfer during the no-field jumping-droplet condensation mode. Due to the lack of longevity studies, i.e., >5 minutes, (which was outside of the scope of the initial Nano Letters paper), the progressive flooding phenomenon was not identified, and therefore, not reported.

S11. Heat Transfer Model

For the model, $h_c$ was obtained by incorporating the individual droplet heat transfer with droplet size distribution:

$$h_c = \frac{q''}{\Delta T} = \frac{1}{\Delta T} \int_{R^*}^{R_c} q(R) n(R) dR, \tag{S15}$$

$$q(R) = \frac{\pi R^2 \left( \Delta T - \frac{2 T_{sat} \gamma}{R h_{fg} \rho_w} \right)}{\left[ \frac{1}{2 h_{int}(1-\cos\theta)} + \frac{R\theta}{4 k_w \sin\theta} + \frac{1}{k_{MC}\sin^2\theta} \left[ \frac{k_P \varphi}{\delta_{MC} k_P + h k_{MC}} + \frac{k_w(1-\varphi)}{\delta_{MC} k_w + h k_{MC}} \right] \right]^{-1}}, \tag{S16}$$

where q" steady state dropwise condensation heat transfer rate per unit area of the condensing surface, $\Delta T$ is the temperature difference between the saturated vapor and sample outer surface ($\Delta T$=($T_{sat}$(P)–$T_s$)), R* is the critical radius for heterogeneous nucleation (R*=$r_c$), $R_c$ is the droplet coalescence radius, q(R) is the individual droplet heat transfer (equation (S15)), n(R) is the non-interacting droplet size distribution, R is the droplet radius, $\gamma$ is the condensate surface tension, $h_{fg}$ is the latent heat of phase change, $\rho_w$ is the condensate density (liquid water), $\theta$ is the droplet contact angle, $h_{int}$ is the interfacial heat transfer coefficient, $k_w$ is the condensate thermal conductivity, $k_{HC}$ is the hydrophobic coating thermal conductivity, $\varphi$ is the structured surface solid fraction ($\approx$0.023), h is the structured surface height ($\approx$1 µm), and $\delta_{HC}$ is the hydrophobic coating thickness ($\approx$10 nm).

See, Miljkovic, N.; Enright, R.; Wang, E. N. Effect of Droplet Morphology on Growth Dynamics and Heat Transfer during Condensation on Superhydrophobic Nanostructured Surfaces. *ACS Nano* 2012, 6, 1776-1785, Miljkovic, N.; Enright, R.; Wang, E. N. Modeling and Optimization of Superhydrophobic Condensation. *J. Heat Transf.* 2012, 135, 111004, Kaschiev, D. *Nucleation: Basic Theory With Applications*. Butterworth Heinemann: Oxford, 2000, and Carey, V. P. *Liquid-Vapor Phase-Change Phenomena: An Introduction to the Thermophysics of Vaporization and Condensation Processes in Heat Transfer Equipment.* 2nd ed.; Taylor and Francis: New York, 2008; p xxii, 742 p, each of which is incorporated by reference in its entirety.

The size distribution n(R) is determined by $$n(R) = \frac{1}{3\pi R_c^3 R_e}\left(\frac{R_c}{R_e}\right)^{-\frac{2}{3}}\frac{R(R_c - R^*)}{R - R^*}\frac{A_2 R + A_3}{A_2 R_c + A_3}\exp(B_1 + B_2) \quad (S17)$$

where $$B_1 = \frac{A_2}{\tau A_1}\left[\frac{R_c^2 - R^2}{2} + R^*(R_c - R) - R^{*2}\ln\left(\frac{R - R^*}{R_c - R^*}\right)\right] \quad (S18)$$

$$B_2 = \frac{A_3}{\tau A_1}\left[R_c - R - R^*\ln\left(\frac{R - R^*}{R_c - R^*}\right)\right] \quad (S19)$$

$$\tau = \frac{3R_c^2(A_2 R_c + A_3)^2}{A_1(11 A_2 R_c^2 - 14 A_2 R_c R^* + 8 A_2 R_c - 11 A_3 R^*)} \quad (S20)$$

$$A_1 = \frac{\Delta T}{h_{fg}\rho_w(1 - \cos\theta)^2(2 + \cos\theta)} \quad (S21)$$

$$A_2 = \frac{\theta}{4 k_w \sin\theta} \quad (S22)$$

$$A_3 = \frac{1}{2h_i(1 - \cos\theta)} + \frac{1}{k_{HC}\sin^2\theta}\left[\frac{k_p\varphi}{\delta_{HC}k_p + hk_{HC}} + \frac{k_w(1 - \varphi)}{\delta_{HC}k_w + hk_{HC}}\right]^{-1} \quad (S23)$$

The integral in equation (S15) represents the heat flux component from droplets smaller than the coalescence length scale ($R<R_c$), where direct growth by vapor accommodation at the liquid-vapor interface dominates, and neighboring droplet coalescence is absent. To account for returning jumping droplets, the developed model was modified by assuming that the droplet departure radius ($R_c$) is equivalent to the coalescence length (jumping condition), however the maximum droplet size on the surface ($R_e$) is larger than the departure radius due to the return of droplets via entrainment.

The model results were obtained using experimentally determined droplet departure radii ($R_e$=5 μm) and contact angles, and assuming an effective nucleation density N from previous ESEM studies of condensation on CuO surfaces. See, Enright, R.; Dou, N.; Miljkovic, N.; Nam, Y.; Wang, E. N. Condensation on Superhydrophobic Copper Oxide Nanostructures. *3rd Micro/Nanoscale Heat Mass Transf Int. Conference* 2012, which is incorporated by reference in its entirety. To model the individual droplet growth more accurately for the jumping-droplet surface, the variable contact angle during the initial stages of growth was incorporated.

Although the invention has been described above with respect to a preferred embodiment and various modifications thereof, it is apparent that the forgoing and other changes in form and detail may be made therein by one skilled in the art while still remaining within the spirit and scope of the invention.

What is claimed is:

1. A method of controlling condensation of droplets on a surface comprising
    condensing a liquid from a vapor phase onto a superhydrophic surface configured to condense the liquid from the vapor phase to form a droplet,
    jumping the droplet from the surface allowing it to induce an electrostatic charge in the droplet, and
    applying an external electric field to the surface to enable control and removal of the charged jumping droplet from the surface.

2. The method of claim 1, wherein the surface comprises a substrate including a metal and including a plurality of nanostructures on a surface of the substrate including a metal oxide of the metal, and a surface modifying layer on at least a portion of the nanostructures.

3. The method of claim 2, wherein the surface modifying layer includes a thiol on a surface of the nanostructures.

4. The method of claim 3, wherein the thiol is an alkyl thiol.

5. The method of claim 4, wherein the alkyl thiol is a fluorinated alkyl thiol.

6. The method of claim 2, wherein the surface modifying layer includes a silane on a surface of the nanostructures.

7. The method of claim 6, wherein the silane is an alkyl silane.

8. The method of claim 7, wherein the alkyl silane is a fluorinated alkyl silane.

9. The method of claim 2, wherein the surface modifying layer includes a fluorinated polymer.

10. The method of claim 2, wherein the surface is made of a material selected from the group consisting of silicon, silica, copper, copper oxide, zinc oxide and aluminum.

11. The method of claim 2, wherein a portion of the surface includes a surface modifying layer including a surface modifying compound.

12. The method of claim 2, wherein the surface further comprises a metal coating on the nanostructures.

13. The method of claim 12, wherein the surface modifying layer includes a self-assembled monolayer on the metal coating.

* * * * *